(12) United States Patent
Ludwig et al.

(10) Patent No.: US 7,765,080 B2
(45) Date of Patent: Jul. 27, 2010

(54) SYSTEM FOR TESTING SMART CARDS AND METHOD FOR SAME

(75) Inventors: Clifford V. Ludwig, Saratoga, CA (US);
Dan P. Bullard, Aloha, OR (US);
Michael R. Ferland, Tualatin, OR (US);
Eric N. Parker, Portland, OR (US);
James W. St. Jean, Meredith, NH (US);
David D. Reynolds, Gilford, NH (US)

(73) Assignee: Nextest Systems Corporation, San Jose, CA (US)

( * ) Notice: Subject to any disclaimer, the term of this patent is extended or adjusted under 35 U.S.C. 154(b) by 782 days.

(21) Appl. No.: 11/437,343

(22) Filed: May 19, 2006

(65) Prior Publication Data
US 2006/0276989 A1 Dec. 7, 2006

Related U.S. Application Data

(60) Provisional application No. 60/683,376, filed on May 19, 2005.

(51) Int. Cl.
*G01M 19/00* (2006.01)
*G11C 29/00* (2006.01)
*G01R 31/28* (2006.01)
*G06F 11/00* (2006.01)

(52) U.S. Cl. .................... 702/122; 714/742; 714/744; 714/718

(58) Field of Classification Search .................... None
See application file for complete search history.

(56) References Cited

U.S. PATENT DOCUMENTS

| 5,566,088 | A | 10/1996 | Herscher et al. |
| 6,392,866 | B1 | 5/2002 | Dinteman |
| 6,466,007 | B1 * | 10/2002 | Prazeres da Costa et al. ............ 324/158.1 |
| 6,643,798 | B2 | 11/2003 | Barton et al. |
| 7,127,529 | B2 * | 10/2006 | Montgomery et al. ........ 710/1 |
| 2001/0000814 | A1 * | 5/2001 | Montgomery et al. ....... 710/10 |
| 2002/0055822 | A1 | 5/2002 | Amadeo et al. |
| 2003/0208653 | A1 * | 11/2003 | Butcher et al. ............ 710/306 |
| 2005/0034028 | A1 * | 2/2005 | Son ............................ 714/43 |
| 2006/0086806 | A1 * | 4/2006 | Conraux et al. ............ 235/492 |

\* cited by examiner

*Primary Examiner*—Kevin L Ellis
*Assistant Examiner*—Guerrier Merant
(74) *Attorney, Agent, or Firm*—Dorsey & Whitney LLP

(57) ABSTRACT

A system and method for testing multiple smart card devices in parallel and asynchronously are provided. The system includes a smart card module that may be easily inserted in a digital test system. The smart card module includes multiple smart card instrument channels, each one of which testing a separate smart card device independently and asynchronously from the others. The smart card instrument channels employ a novel modulation technique based on palette waveforms that are formed of transitions between two data bits.

17 Claims, 39 Drawing Sheets

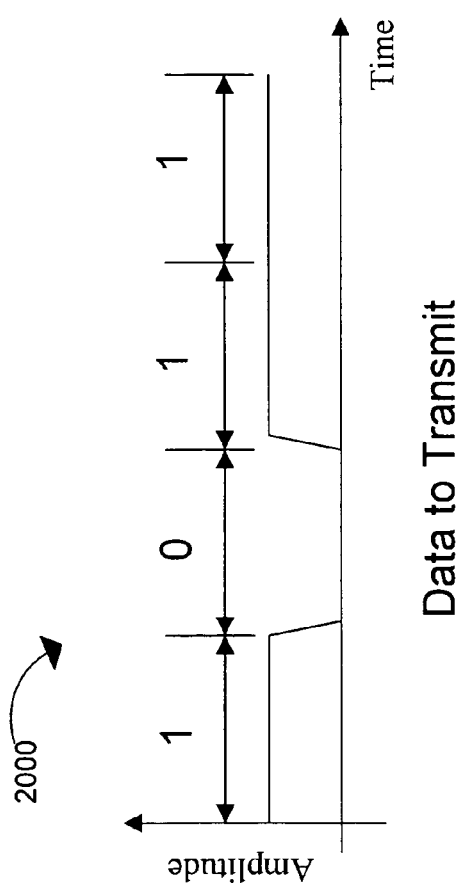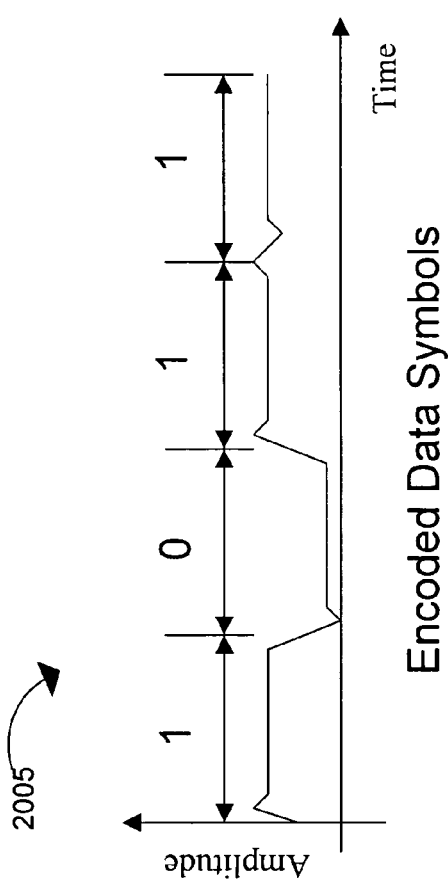
FIG. 20A

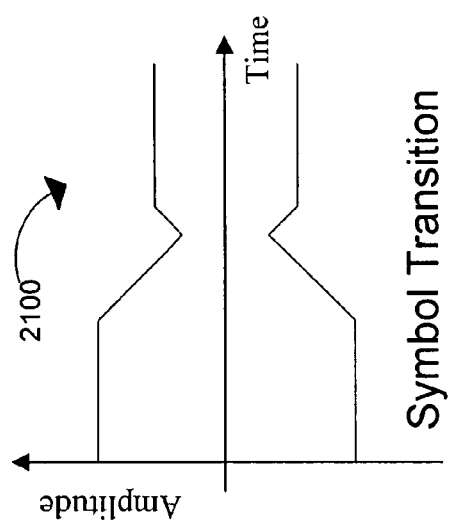
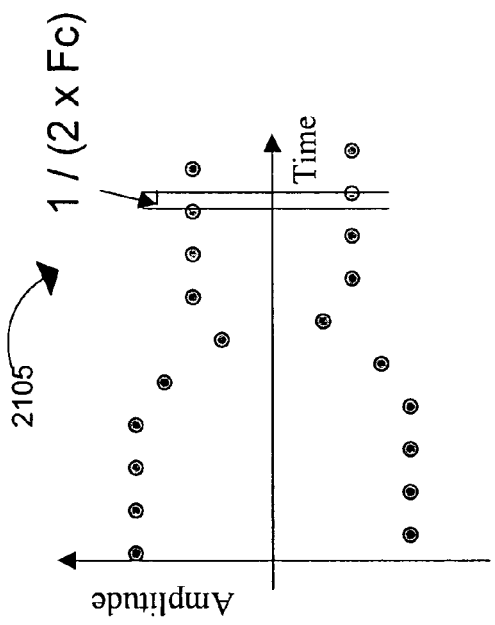
FIG. 21

US 7,765,080 B2

SYSTEM FOR TESTING SMART CARDS AND METHOD FOR SAME

CROSS REFERENCE TO RELATED APPLICATIONS

The present application claims priority to U.S. Provisional Patent Application No. 60/683,376 filed on May 19, 2005, the entire disclosure of which is incorporated herein by reference.

FIELD OF THE INVENTION

The present invention relates generally to circuit testing technologies, and in particular to automated testing of contact-less smart card devices.

BACKGROUND INFORMATION

Contact-less smart card devices are typically credit-card sized electronic devices that are used in many applications in financial transactions, security, and information storage. Contact-less smart cards are unique in their ability to communicate wirelessly over a radio frequency ("RF") link to a computer system. For example, a contact-less smart card can serve as a "ticket" for a subway system and include an internal representation of the ticket purchase price. As the purchaser enters the subway gate, a smart card reader in the gate area wirelessly communicates with the purchaser's smart card, debits the smart card for the cost of the train ride, and unlocks the gate for the purchaser's entry to the train platform. The smart card can reside anywhere on or near the purchaser and does not have to be removed from a purse or wallet for use.

Internal to a smart card are various electronic devices that provide memory and control logic for implementing various computational systems. A smart card device also contains an RF transceiver that provides the mechanism for communication between the smart card and the outside world. As with any semiconductor integrated circuit, a necessary portion of the smart card manufacturing process involves testing that the circuit is operational, including the wireless RF link in the smart card, and determining if the smart card meets various electrical signaling specifications.

While there are numerous test systems for testing logic and memory on an integrated circuit by making direct contact with pads on the integrated circuit, these systems lack the ability to flexibly generate, receive, and test the necessary RF signals to communicate and test a smart card. Test systems capable of testing smart card devices, for example, as disclosed in U.S. Pat. No. 6,466,007, may be able to test multiple smart card devices in parallel and synchronously and thus have limitations on their abilities to handle the asynchronous response time of a large collection of smart card devices. In some cases, smart card devices that operate correctly may fail to test correctly due to the limitations of the testing system and thus must be re-tested. This is very inefficient and causes an increase in testing costs.

There is therefore a need to provide an automated, flexible, and efficient system for testing smart card devices.

SUMMARY OF THE INVENTION

In view of the foregoing, the present invention provides a system for testing a plurality of radio frequency smart card devices. The system includes a smart card module having a plurality of smart card instrument channels adapted to test one of the plurality of radio frequency smart card devices. Each smart card device is tested independently and asynchronously from the others.

In one embodiment, each smart card instrument channel includes a novel modulator for testing a plurality of smart card devices with a test signal having at least two bits. The modulator is based on palette waveforms corresponding to a transition between the two data bits. The modulator includes a palette memory configured to store a plurality of palette waveforms, a digital to analog converter coupled to the palette memory for generating an analog signal for each palette waveform, and a reconstruction filter coupled to the digital to analog converter for filtering the analog signal.

BRIEF DESCRIPTION OF THE DRAWINGS

The accompanying drawings, which are somewhat schematic in some instances and are incorporated in and form a part of this specification, illustrate several embodiments of the invention and, together with the description, serve to explain the principles of the invention.

FIGS. 20A and 20B show simplified illustrations of the Type-B modulation for use with a modulator of FIG. 12;

FIG. 21 illustrates the symbol transitions used by the modulator shown in FIG. 12;

DETAILED DESCRIPTION OF EMBODIMENTS OF THE INVENTION

Generally, in accordance with exemplary embodiments of the present invention, a smart card test system and method are provided for flexible and asynchronous testing of smart card devices to determine if the smart card devices function correctly and meet relevant electrical signaling specifications. The smart card test system provides appropriate RF signals to stimulate a smart card, receives the RF signals generated by a smart card, and determines if a smart card RF interface and its internal memory and logic are good or defective, in a manner that provides great flexibility and ease of use, with a reduced cost.

Most smart card devices include an RF transceiver, a microcomputer, and a memory. As generally used herein, a "contact-less" smart card refers to an integrated circuit device, usually encapsulated and having the size of a credit card, that makes use of an RF interface for communications without the need for direct "wired" contacts. Some RF cards may be "dual interface" cards that have both contacted (wired) and contact-less interfaces. In all cases, RF smart card die have digital pads that provide access to the microcomputer and memory on the die, and two RF pads that provide access to the RF transceiver. Both the digital and RF pads may be probe tested. After encapsulation, only the RF pins are available for testing.

Communication between a smart card and a smart card reader makes use of a well-documented, industry standard, layered protocol. This protocol includes a physical layer, in which an RF carrier is modulated with digital data. A second layer, the data link layer, groups bits into characters. A third layer, the network layer, groups data into frames, with a Cyclic Redundancy Check ("CRC") code. Yet higher protocol layers establish a valid applications connection between the reader and the smart card. Both the reader and the smart card insert time delays between characters and at the transition between transmit and receive operations. Details about this protocol may be found in various standard documents, published by the International Organization for Standardization ("ISO") including the ISO standards 14443-2, 14443-3, and other ISO test standards, such as ISO standard 10373-6, which are incorporated herein by reference.

Smart Card Test System Overview

Figure 1:
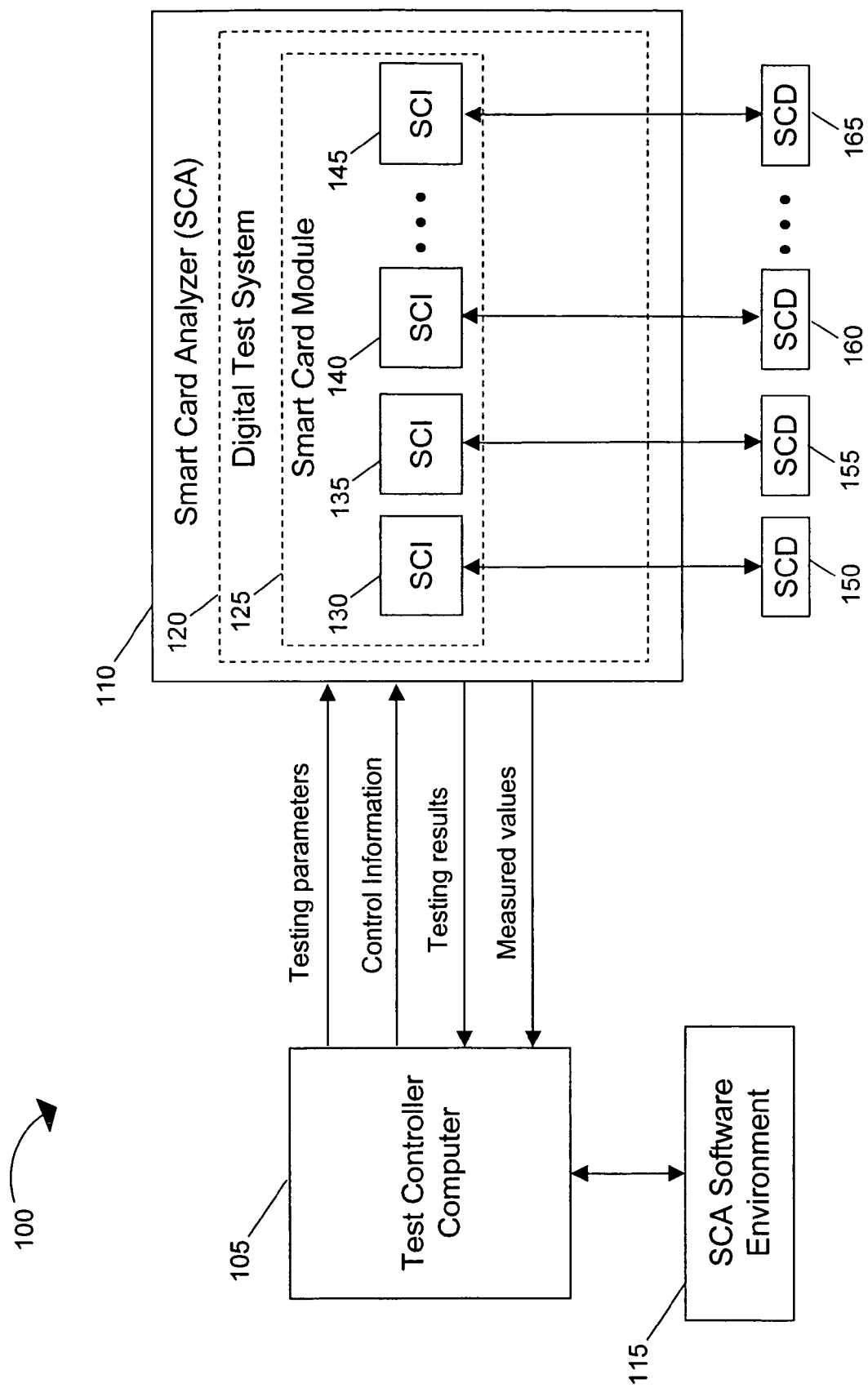
FIG. 1 shows a schematic diagram of a smart card test system for testing contact-less smart card devices in accordance with the present invention.

An exemplary schematic diagram of a smart card test system for testing contact-less smart card devices in accordance with the present invention is shown in FIG. 1. Smart card test system 100 includes hardware necessary to test the RF interface of a smart card, such as test controller computer 105 interfaced to a smart card test instrument or Smart Card Analyzer ("SCA") 110. Test controller 105 loads test parameter and control information into SCA 110, and collects test results and measured values from SCA 110. Test controller 105 also provides software development, debug, and execution environment 115 for SCA 110.

SCA 110 includes digital test system 120 for testing semiconductor components. As generally used herein, such a digital test system may include various instruments or cards used for testing memory, digital, mixed signal and system-on-chip ("SOC") components, including smart card devices, both at the wafer and packaged stages. In an exemplary embodiment, digital test system 120 may be the Maverick digital test system with the Lightning mixed-signal option, sold by Nextest Systems Corporation of San Jose, Calif., with one or more unique add-on modules tailored for testing smart cards. These modules are generally referred to herein as Smart Card Modules ("SCMs"), an example of which includes SCM 125. Digital test system 120 may also include an Analog Capture Instrument ("ACI") module. The architecture of digital test system 120 is described in more detail herein below.

SCM 125 has a plurality of identical hardware units, referred to herein as Smart Card Instrument ("SCI") Channels, such as SCIs 130, 135, 140, and 145. Each of these SCIs tests one Smart Card Device ("SCD"). For example, SCI 130 tests SCD 150, SCI 135 tests SCD 155, SCI 140 tests SCD 160, and SCI 145 tests SCD 165. An SCD may also be generally referred to herein as a Proximity Integrated Circuit Card ("PICC"). An SCD being tested by smart card test system 100 may also be generally referred to as a Device Under Test ("DUT").

Since SCM 125 may have a plurality of SCIs, SCM 125 can simultaneously test a plurality of SCDs. One or more interconnects (not shown) may be provided to allow loading of information into each SCI channel, such as SCI channels 130, 135, 140, and 145, starting execution of the SCI channel, and reading results from the SCI channel. SCI channels do not communicate with other SCI channels, nor with other portions of the tester hardware or tester controller 105, until the testing of all SCDs is completed. As a result, SCA 110 can simultaneously and asynchronously test a plurality of SCDs.

Each SCI channel serves as a special smart card reader, which allows all RF parameters, data values, and protocol delays to be controlled, tested, and measured. Each SCI in SCM 125 transmits an RF data stream to an SCD, and receives an RF data stream back from the SCD. The SCI can vary the parameters of the transmitted RF data stream in numerous ways, because the transmitter waveform generation is very flexible, providing complete control over test parameters. The SCI can also test and measure the parameters of the received RF data stream. In accordance with the present invention smart card test system 100 provides the efficiency, flexibility and ease of use desired in controlling, testing, and measuring these various parameters.

Digital Test System Architecture

In accordance with this exemplary embodiment, digital test system 120 may be designed in two versions. Both versions of digital test system 120 include software that provides a flexible user interface for program development, debug, and execution, as well as diagnostic and calibration software.

Figure 2A:
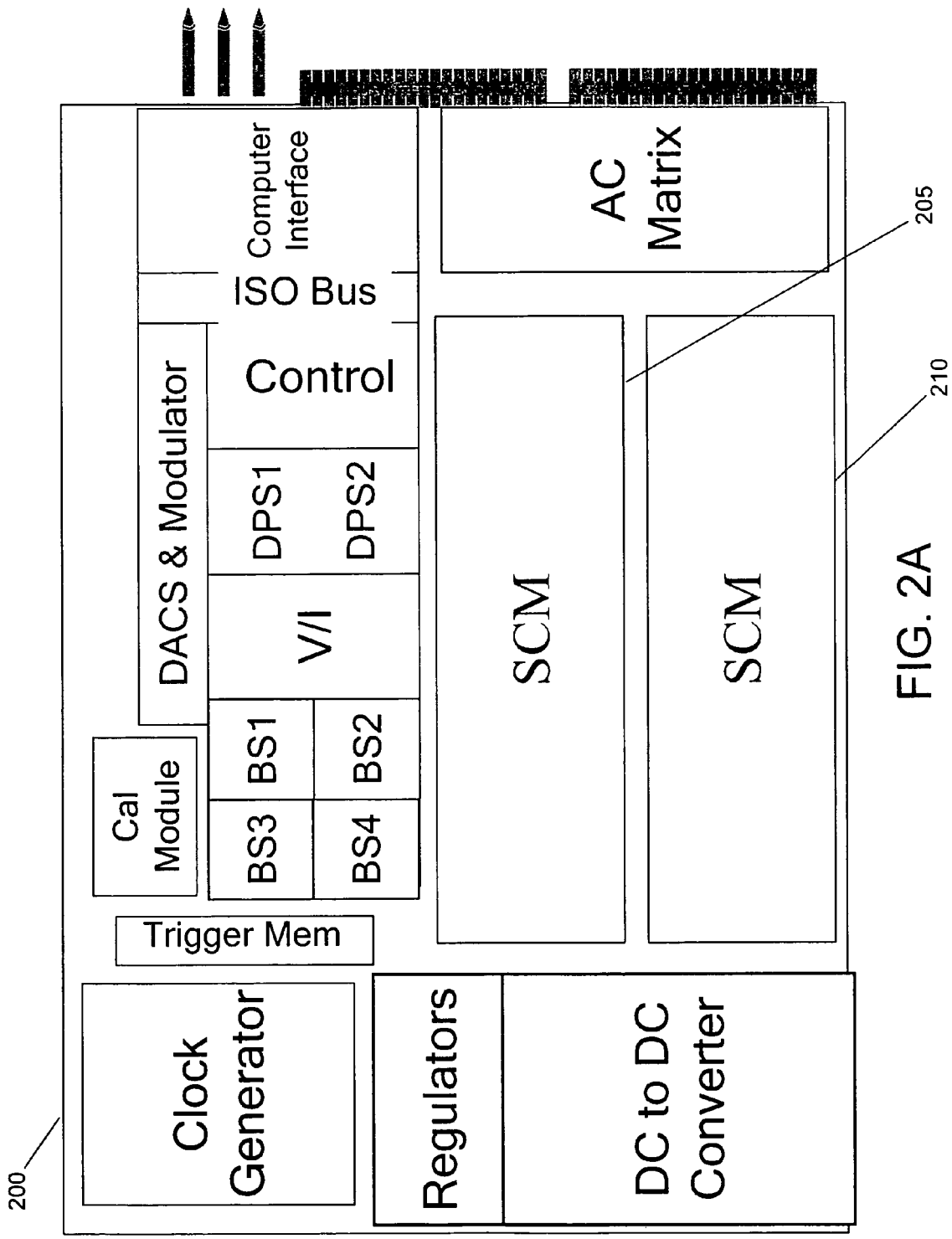
FIG. 2A shows a schematic diagram of one embodiment of a digital test system incorporating the smart card test system of FIG. 1.

The first version, version 200 shown in FIG. 2A, is a production version designed to provide a complete production probe test solution for contact-less and dual-interface smart cards. This version may include a high pin count Maverick system with the Lightning option, i.e., a four or eight site system, with 48 digital pins and 16 RF pins per site. The 16 RF pins reside on an Mixed Signal Pin Card ("MSPC") board, described in more detail herein below, which contains two SCMs (SCM 205 and SCM 210). Each SCM in version 200 may provide the RF resources to test 4 SCDs (8 pins). That is, as show, version 200 may test 8 SCDs simultaneously and asynchronously.

Figure 2B:
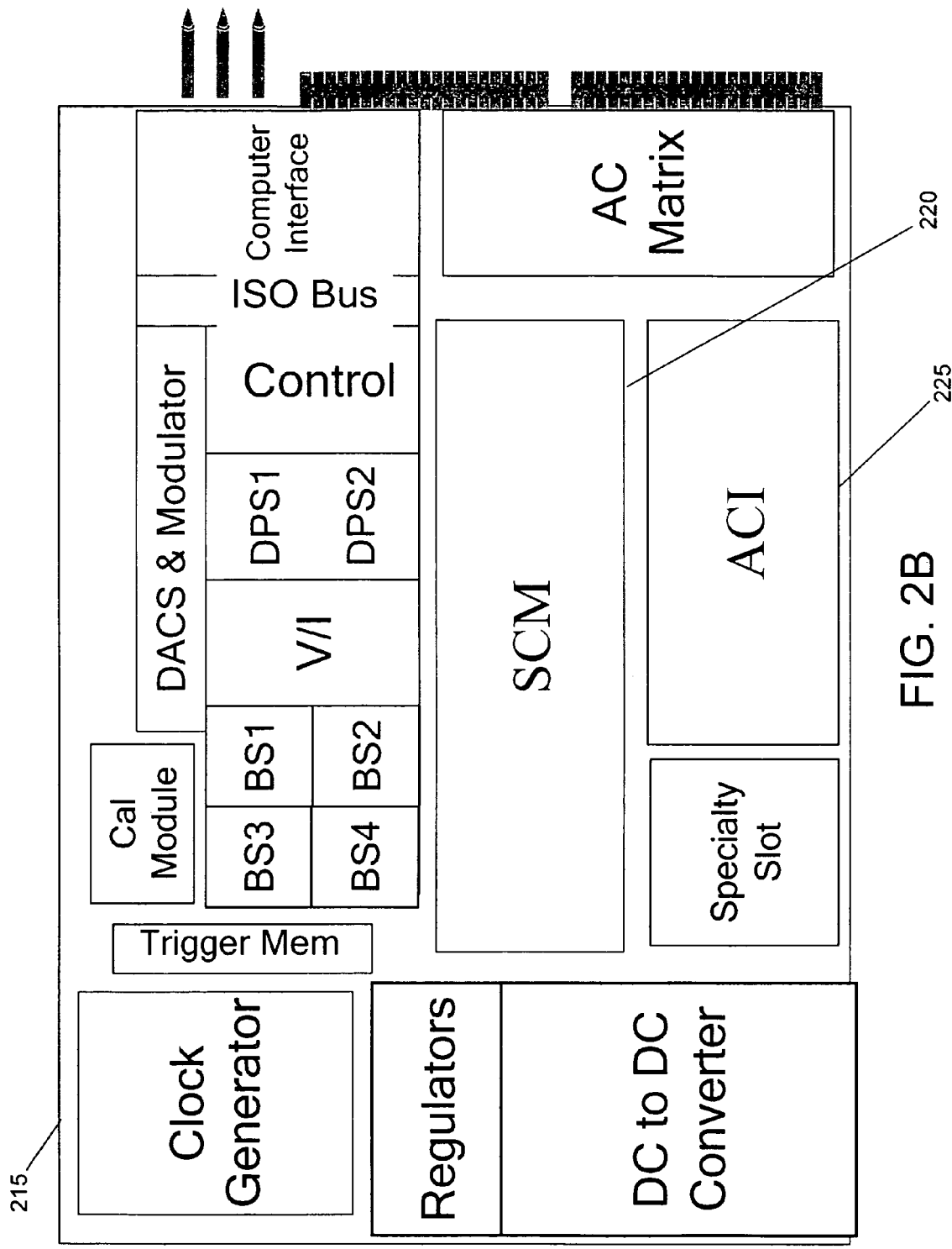
FIG. 2B shows a schematic diagram of another embodiment of a digital test system incorporating the smart card test system of FIG. 1.

The second version of digital test system 120, version 215 shown in FIG. 2B, is an engineering configuration. This version may include a Maverick system with the Lightning PTHF option, i.e., a single site system, with 48 digital pins and 16 RF pins. In this case, the MSPC board contains one SCM (SCM 220), with resources for four SCDs, and one ACI (ACI 225) for full-speed RF capture. Version 215 may support testing of up to 4 SCDs.

With either version, digital test system 120 is integrated into a "Site" architecture. A site includes 64 channels, i.e., pins, that provide parametric and functional stimulus and response test capability, and 8 channels or pins of Device Power Supply ("DPS"). A site pin connects to a corresponding pin on the SCD to be tested. Test controller computer 105 (FIG. 1) executes a test application program in SCA software environment 115 and controls the site hardware. Each SCA site in a production version, for example, contains all the necessary resources to test 8 SCDs simultaneously and asynchronously, with each site including one of digital test system 120. Simultaneous testing allows multiple devices to be tested at the same time, which lowers the cost of the test. Since SCDs are asynchronous in behavior, asynchronous test capability provides better overall throughput, as the tester can test as fast as the smart card can respond, and does not need to wait for a tester resource to synchronize or become available.

A smart card test system designed in accordance with the present invention such as smart card test system 100 may comprise one to eight sites, as determined by its mechanical package (basically, its size). For example, the configuration of an SCA four site system package in a production version, referred to herein as a "SST," contains four sites, and therefore can test 32 SCDs simultaneously (with each site having one digital test system including a production version of an MSPC board capable of testing 8 SCDs).

Figure 3:
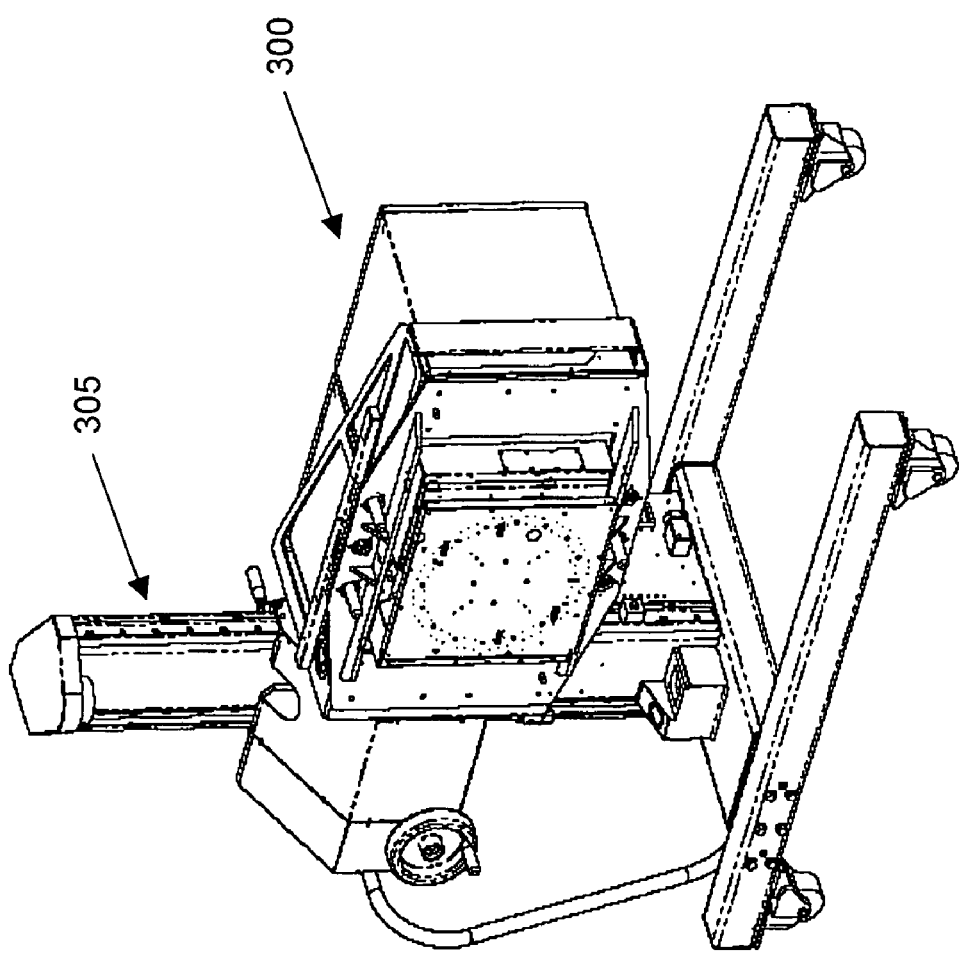
FIG. 3 shows a perspective view of an exemplary SST mounted on a manipulator and incorporating the digital test system that utilizes the smart card test system of the present invention.

A SST mounted on a manipulator is shown in FIG. 3. SST 300 is a box-like mechanical package that incorporates the test hardware, power supplies for the hardware, and the various cables and mechanical parts. SST 300 is mounted on a manipulator (manipulator 305) that allows an SST package to be easily moved and oriented to connect to other equipment. A host computer (not shown), including a PC, display, keyboard, mouse and a General Purpose Interface Bus ("GPIB"), provides the user with program development capability, and control over the SCA hardware and application program execution.

Figure 4:
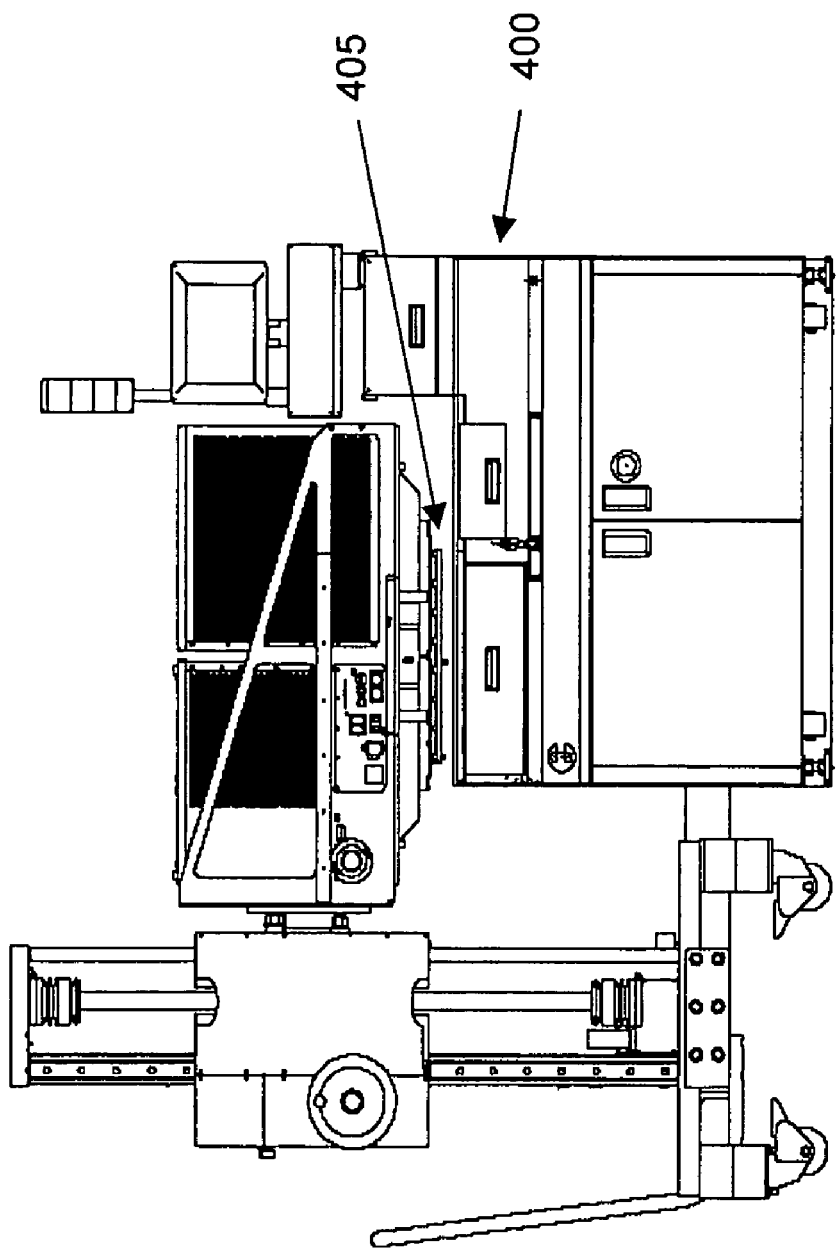
FIG. 4 shows a schematic diagram of the SST of FIG. 3 docked to a wafer prober.

In a typical production use in a test facility, SST 300 would be connected, i.e., docked, to a wafer handling system, also known as a "wafer prober," as shown in FIG. 4 with wafer prober 400. SST 300 may be connected to the wafer to be tested via a multiple part electromechanical assembly known as the "probe interface" (probe interface 405). Note that while SST 300 can simultaneously test 32 SCDs, a typical wafer may contain hundreds of devices.

Wafer prober 400 is responsible for moving a wafer into contact with probe interface 405 so that up to 32 SCDs at a time can be contacted and tested. This movement is repeated until all devices on a wafer have been tested. Wafer prober 400 is controlled by the host computer, via an attached GPIB communications device (not shown).

Figure 5:
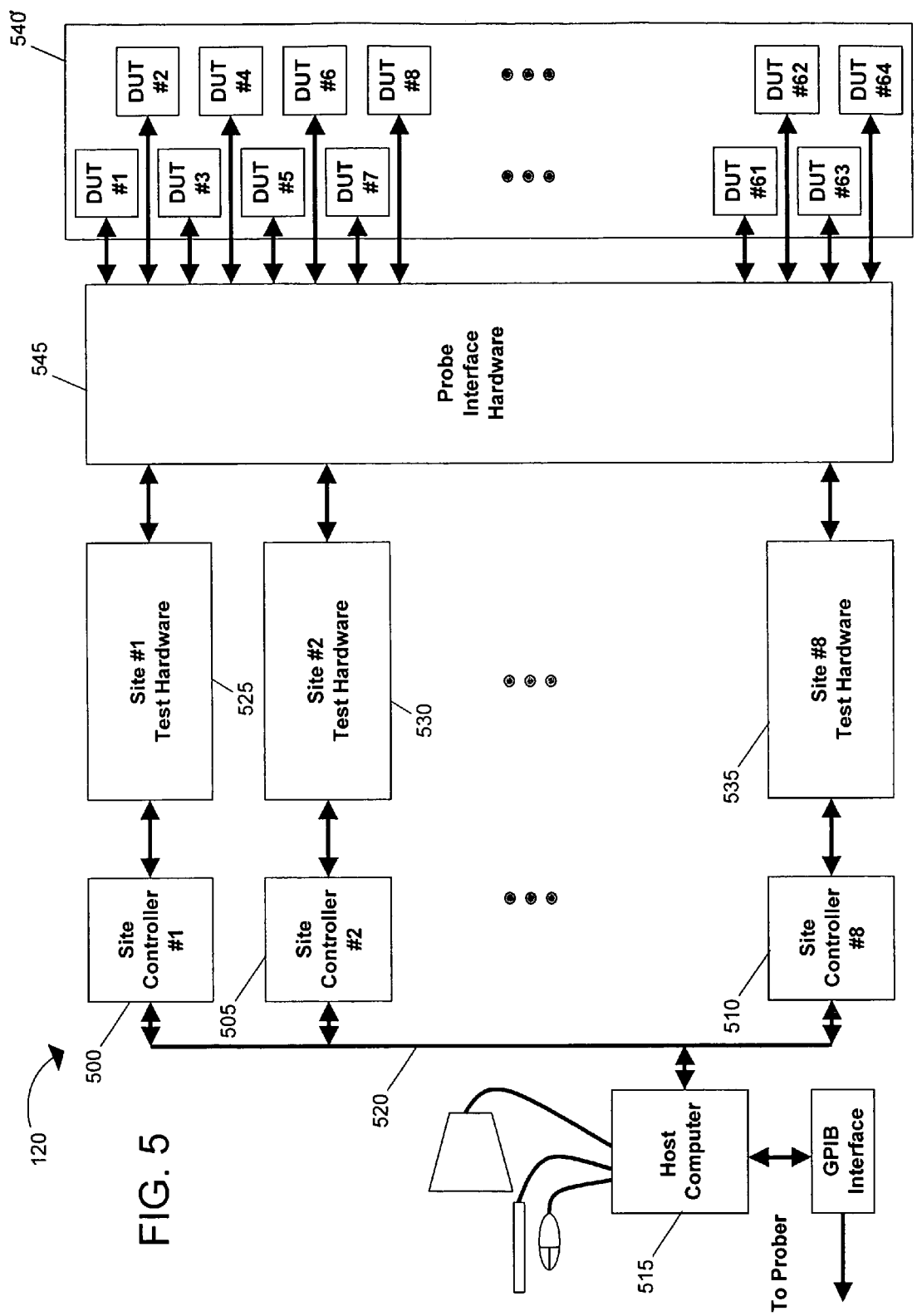
FIG. 5 shows an exemplary block diagram of the architecture of a digital test system incorporating the smart card test system of FIG. 1.

An exemplary block diagram of the architecture of digital test system 120 is shown in FIG. 5. Digital test system 120 may have one or more Site controllers for controlling a site, such as site controllers 500, 505, and 510. Each site controller includes a single-board personal computer ("PC") running embedded Windows NT™, sold by Microsoft Corporation, of Redmond, Wash. It communicates to Host Computer 515 via Ethernet 520. The single-board PC communicates to the test hardware in each site via a PC Tester Interface ("PTI") card. The single-board PC and PTI plug into a backplane that provides power and communications to both boards. For example, site controller 500 communicates to site test hardware 525, site controller 505 communicates to site test hardware 530, and site controller 510 communicates to site test hardware 535.

Figure 6:
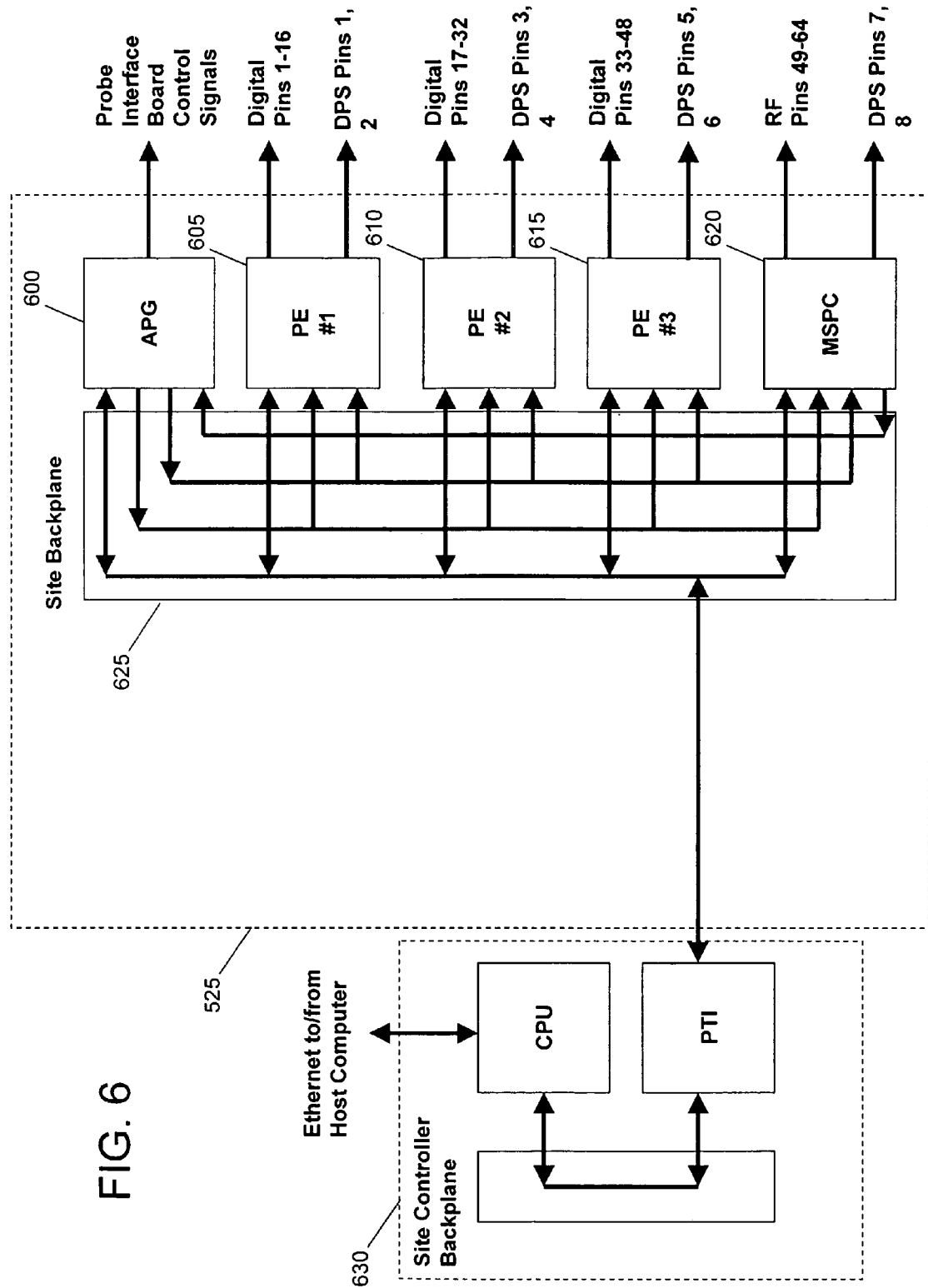
FIG. 6 shows an exemplary schematic diagram of the site test hardware in a digital test system of FIG. 5.

An exemplary schematic diagram of the site test hardware is shown in FIG. 6. Each site test hardware, such as site test hardware 525, includes an Algorithm Pattern Generator ("APG"), such as APG 600, three Pin Electronics ("PE") boards, such as PE boards 605, 610, and 615, and an MSPC board (MSPC board 620). As described above, the MSPC board includes the SCM where the SCIs reside. These boards plug into backplane 625 that provides power and communications to all boards.

APG 600 runs a specialized software program generally referred to herein as a "pattern." Patterns specify the values of multiple digital fields in every system clock period. These fields include X-address, Y-address, algorithmic data, vector address, and various control signals. APG 600 distributes system clock and the various field values to the other site boards. The vector address signals indicate which pattern address is currently being executed. This address is used by PE boards 605, 610, and 615 to select stored data values to apply to the digital drive or compare circuits. This address is also used by MSPC board 620 to determine when to start or stop clocks used to synthesize or capture analog signals.

Each PE board, e.g., PE board 605, PE board 610, and PE board 615, may provide 16 channels or pins of parametric and digital functional stimulus and response test. A timing generator associated with each pin creates a waveform that includes levels and transitions between levels. The transition times are specified for each pin and waveform. Up to 32 unique waveform definitions can be used. The levels associated with each waveform are either a logic-one or a logic-zero, as specified by a selected APG digital field value. A pin driver in each PE board turns the logic levels into specific analog voltage values, and sends the resulting signal to the Device Under Test ("DUT"), which in this case is an SCD. DUTs connected to the PE boards in each site test hardware are shown in FIG. 5 (DUTs 540).

A pin comparator in each PE board receives and compares a signal from each DUT against expected values. Any miscomparison between the DUT's signals and the expected values is deemed a DUT error, and the DUT is classified as defective. Each PE board also provides two separate channels (pins) of Device Power Supply ("DPS") and one Parametric Test Unit ("PMU"). Each DPS pin provides power to one SCD, when the device's RF interface is not in use. The PMU is a "four-quadrant" force and measure device that can be connected to any of the 16 PE pins. It can force current and measure voltage, or force voltage and measure current. This is used in SCA applications to perform opens, shorts, and leakage tests on a smart card's digital pins.

MSPC Architecture

Figure 7:
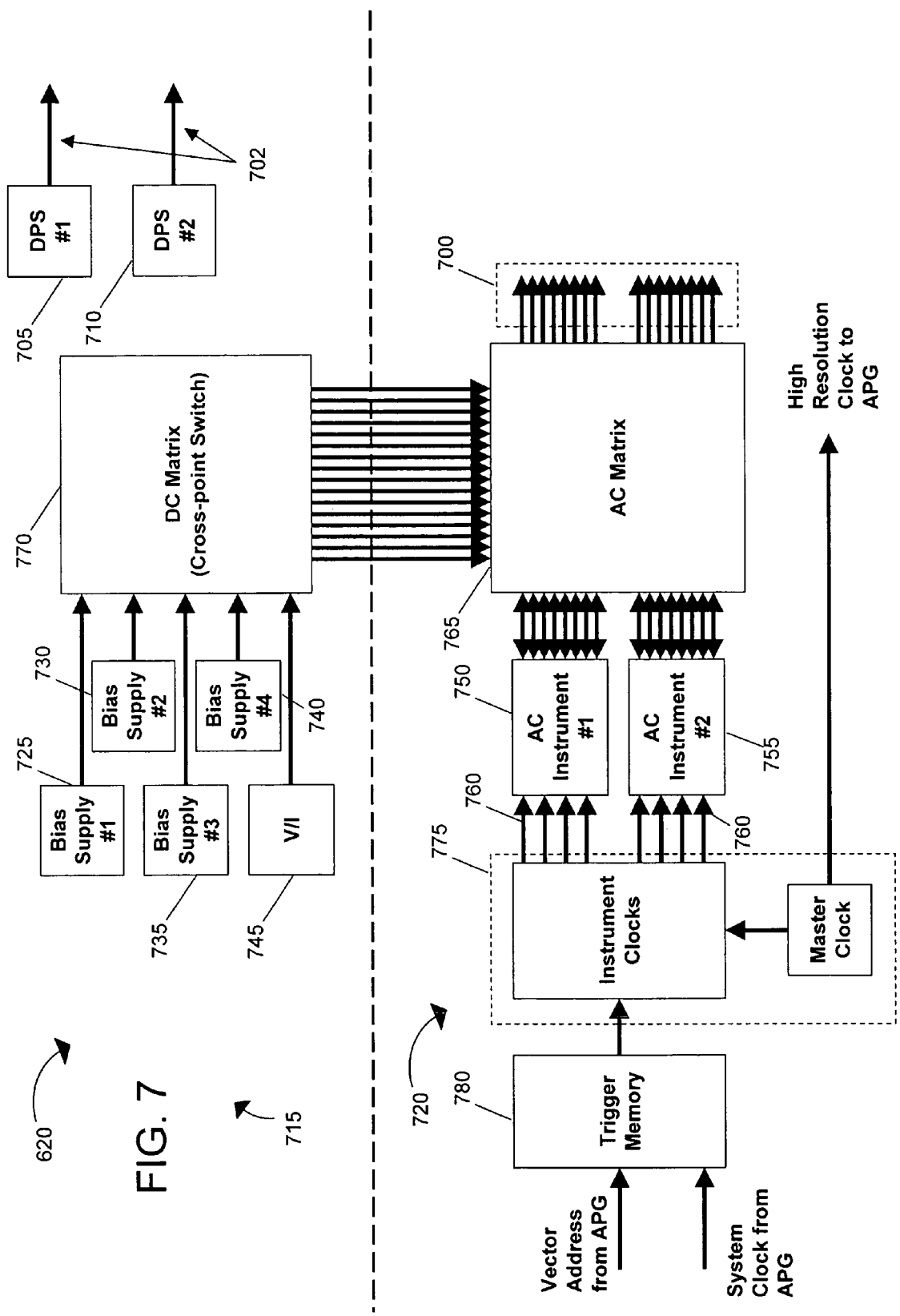
FIG. 7 shows an exemplary block diagram of the architecture of a Mixed Signal Pin Card board for use with the digital test system of FIG. 5.

An exemplary block diagram of the architecture of MSPC 620 is shown in FIG. 7. MSPC 620 provides 16 channels (pins) of RF test capability (pins 700), and two DPS channels (pins 702), i.e., DPS channels 705 and 710. The RF test features are described in more detail herein below. Each DPS pin provides power to one SCD, when the device's RF interface is not in use.

As shown in FIG. 7, MSPC board 620 has two sections, namely, DC instrument section 715 and AC instrument section 720. DC instrument section 715 contains seven DC instruments: four bias supplies (bias supplies 725, 730, 735, and 740), two DPS (DPS 705 and DPS 710), and one V/I (V/I 745). The Bias Supplies and DPSs are force voltage, measure current instruments in which the current draw can be measured while forcing a voltage. The Bias Supplies are used to force a voltage at a moderate current. These are used by the SCM module as described in more detail herein below. The DPSs provide power to the SCD under test, when its RF interface is not in use.

V/I 745 is a "four-quadrant" force and measure device. It can force current and measure voltage, or force voltage and measure current. This is used in SCA applications to perform opens, shorts, and leakage tests on a smart card's RF pins. A cross-point relay matrix allows connection of any bias supply or V/I to any RF pin. The DPS pins are separate and cannot connect to any other MSPC instruments.

AC instrument section 720 provides the infrastructure to support two independent AC instruments, namely, AC instrument 750 and AC instrument 755. These AC instruments are "daughter cards" that attach to MSPC board 620. This allows flexibility in system configuration, and allows application specific hardware to be installed for optimal test performance. In the case of SCA 110 (FIG. 1), a custom instrument, namely, SCM 125, is used in one or both AC instrument positions. The architecture of an SCM is described in more detail herein below.

Each AC instrument receives four independent clocks (760) that have programmable period, pulse-width, and pulse count. These clocks can be triggered by the vector system, that is, by the vector address generated by APG 600 (FIG. 6) and sent via backplane 625 to PEs 605, 610, and 615 and to MSPC board 620, and thus the AC instruments can be started and stopped under APG control. Each AC instrument provides 8 signal connections. AC Matrix 765 allows each AC instrument signal to connect to 2 MSPC RF pins. AC Matrix 765 also connects each signal from DC Matrix 770 to one RF pin. Thus, each AC instrument can connect to all 16 RF pins, and each DC instrument can connect to all 16 RF pins. This provides great flexibility in connecting instrument resources to device pins, which eases application program development, and provides better test throughput.

Some versions of SCA 110, such as engineering version 215 shown in FIG. 2B, make use of another AC instrument, the Analog Capture Instrument ("ACI"). This instrument includes a 14-bit Analog to Digital Converter ("ADC") with a configurable input arrangement. The ADC samples the applied analog input signal, converts the signal to a digital value, and stores the digital value in consecutive locations of a 256 kWord memory (each Word is one digital value). The ADC input can be configured as 8 single-ended inputs, or 4 differential inputs. Input termination, amplification, and filtering functions provide programmable signal conditioning. The ACI can capture analog signals within the range of 100 mV to 8 V, over a frequency range of 1 kHz to 65 MHz. This is an option for SCA 110, and is useful for high-fidelity capture and analysis of SCD RF signals. Each ACI can support up to four SCDs.

SCM/SCI Architecture

Figure 8:
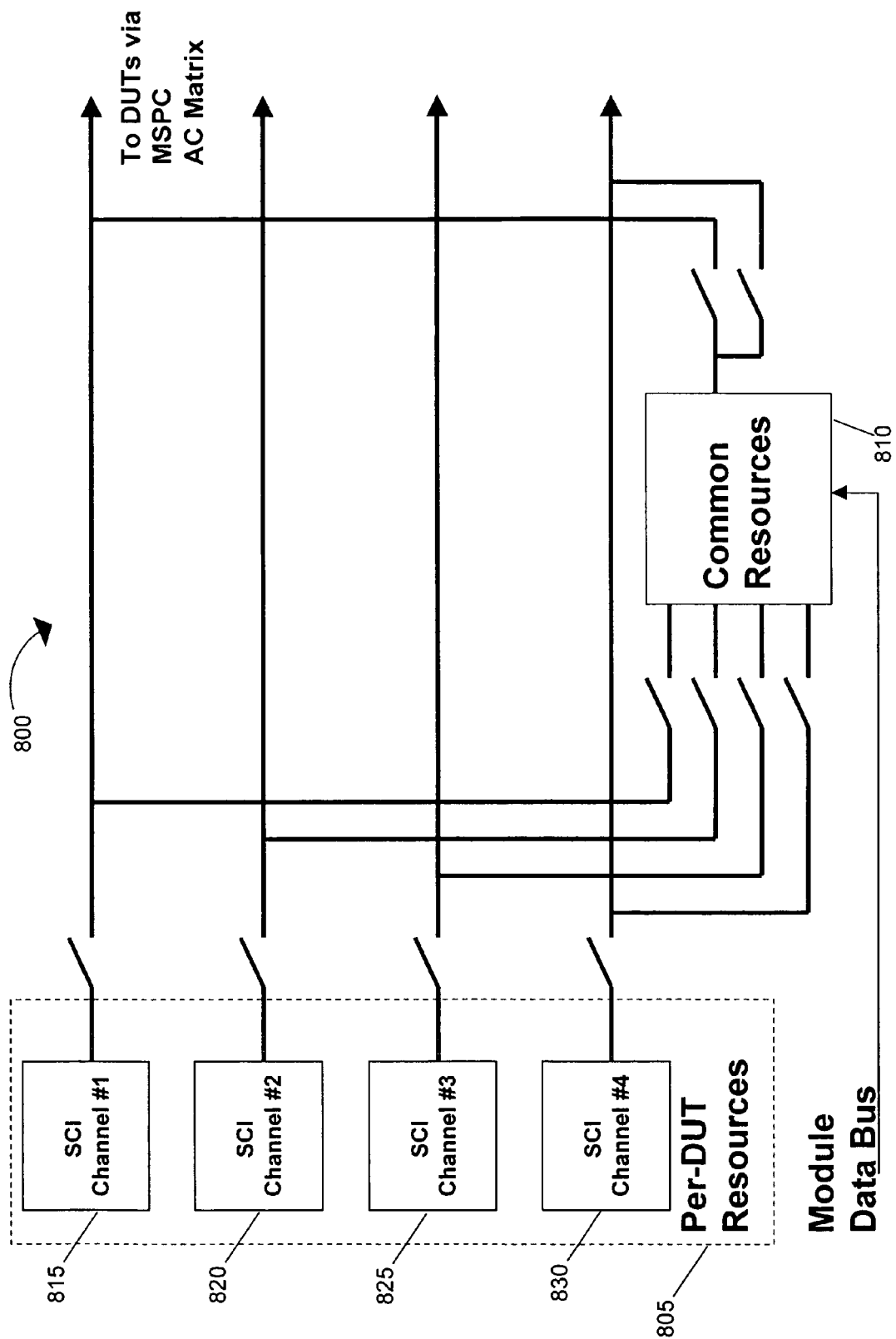
FIG. 8 shows an exemplary schematic diagram of a Smart Card Module for use with the Mixed Signal Pin Card board of FIG. 7.

The architecture of a SCM included in a MSPC board, such as MSPC board 620 shown in FIG. 6, is shown in FIG. 8. SCM 800 includes the resources necessary to test the RF portion of four SCDs. SCM 800 is an MSPC AC instrument module that relies upon the power, interface, and clock circuitry of MSPC board 620. As described above, SCM 800 can be one or both of AC instruments 750 and 755 in MSPC board 620 (see FIG. 7).

SCM 800 includes both per-DUT resources 805, i.e., resources assigned to each DUT or SCD, and shared (common) system resources 810. The per-DUT resources include SCIs 815, 820, 825, and 830, each one of which includes an RF transceiver with associated memory and control logic. Each SCI generates an RF signal to the DUT, receives an RF signal from the DUT, and compares the received signal with expected values. Relays connect each SCI to the DUT's two RF pins. Each SCI operates in parallel with, but is fully asynchronous with and independent of the other SCIs. Each SCI maintains a real-time communication stream with its associated DUT, and determines in real-time if any DUT failures have occurred.

Figure 9:
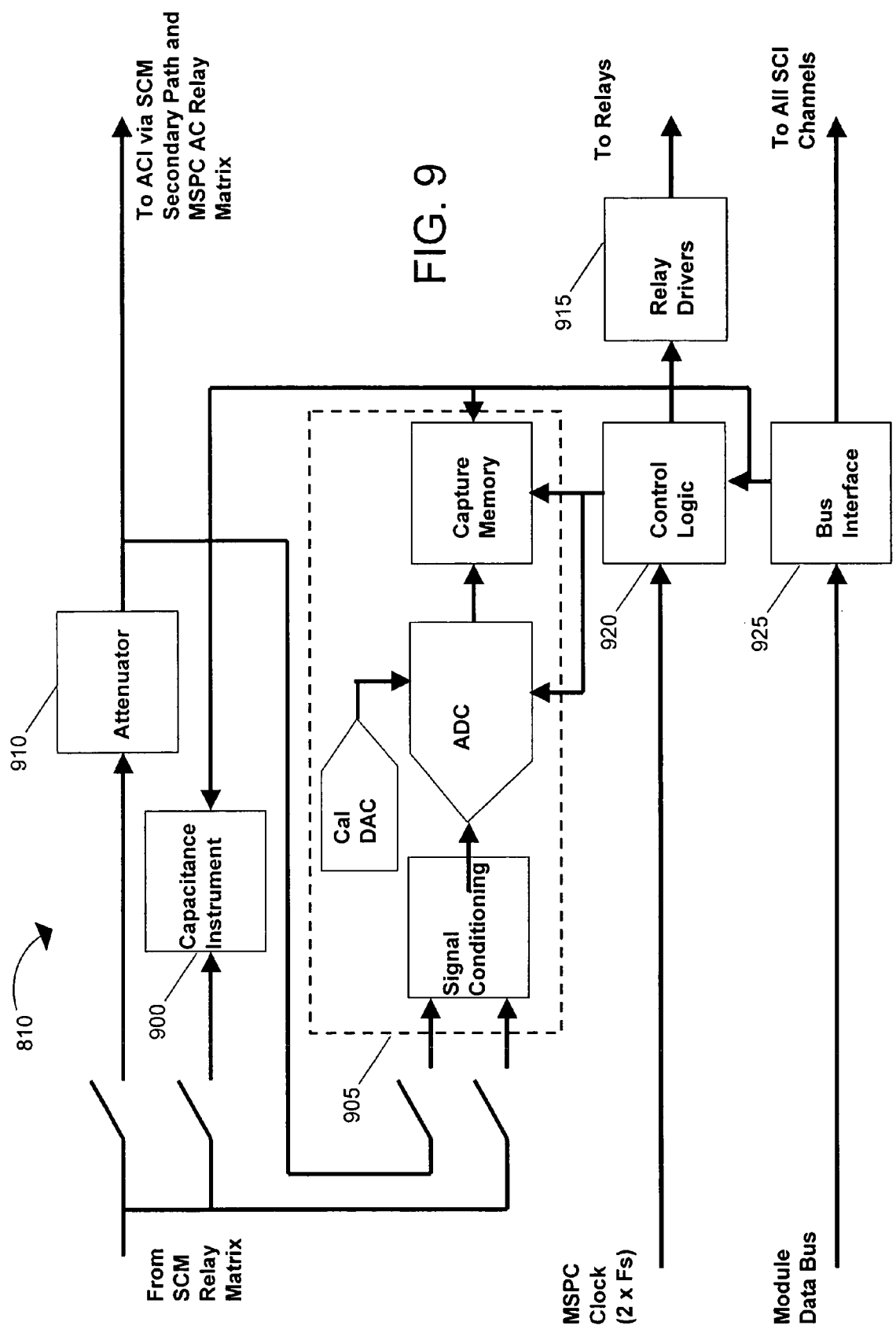
FIG. 9 shows an exemplary schematic diagram of the common system resources included in the Smart Card Module of FIG. 8.

Common system resources 810, shown in more detail in FIG. 9, include RF capacitance instrument 900, sub-carrier capture instrument 905, RF attenuator 910, and relay drivers 915 to connect common system resources 810 to each of the four DUTs via a relay matrix (not shown) powered by relay drivers 915. Each of common system resources 810 operates sequentially across the four DUTs supported by each SCM.

Figure 10:
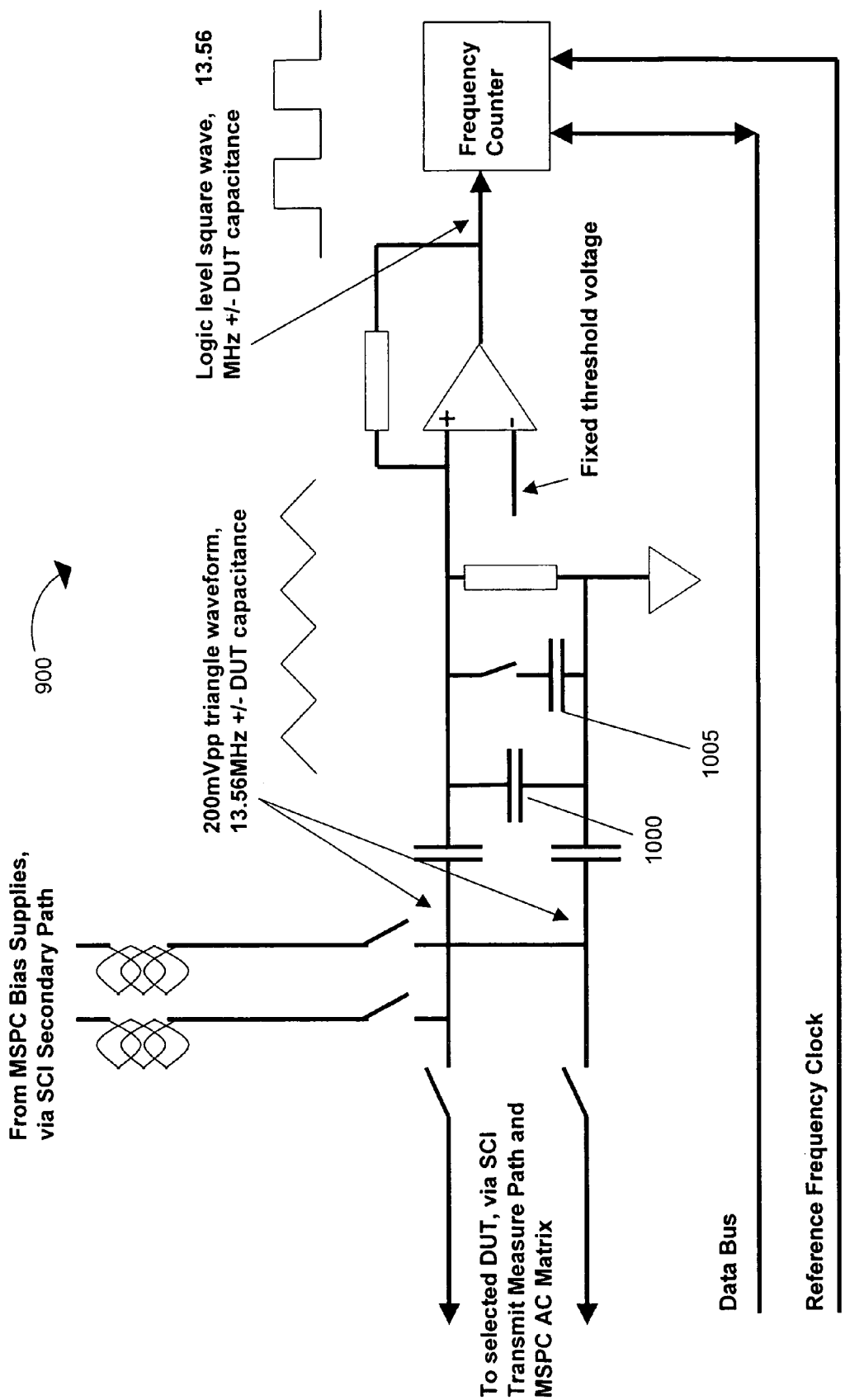
FIG. 10 shows an exemplary schematic diagram of a capacitance instrument included in the common system resources of FIG. 9.

Capacitance instrument 900 includes a simple relaxation oscillator that is tuned by the attached channel capacitance, as shown in FIG. 10. This oscillator is set to a 13.56 MHz center frequency with a nominal capacitance (capacitor 1000), roughly what is expected due to interface cabling without a DUT. Oscillator output is roughly 1 Vpp, and is not adjustable. Relays allow connection of MSPC bias supplies 725, 730, 735, and 740 (FIG. 7) to capacitance instrument 900, to provide a DC offset of up to +/−16V. Relays connect capacitance instrument 900 to the DUT via a measure transmit bus and the selected SCI RF channel, e.g., SCI channel 815, 820, 825, or 830 (FIG. 8).

In addition, API functions connect capacitance instrument 900 to the selected SCI channel, perform the measurement, and provide a result. The result is calibrated with the use of calibration capacitor 1005 to remove the effects of any stray tester channel capacitance or variation in circuit performance.

Figure 11:
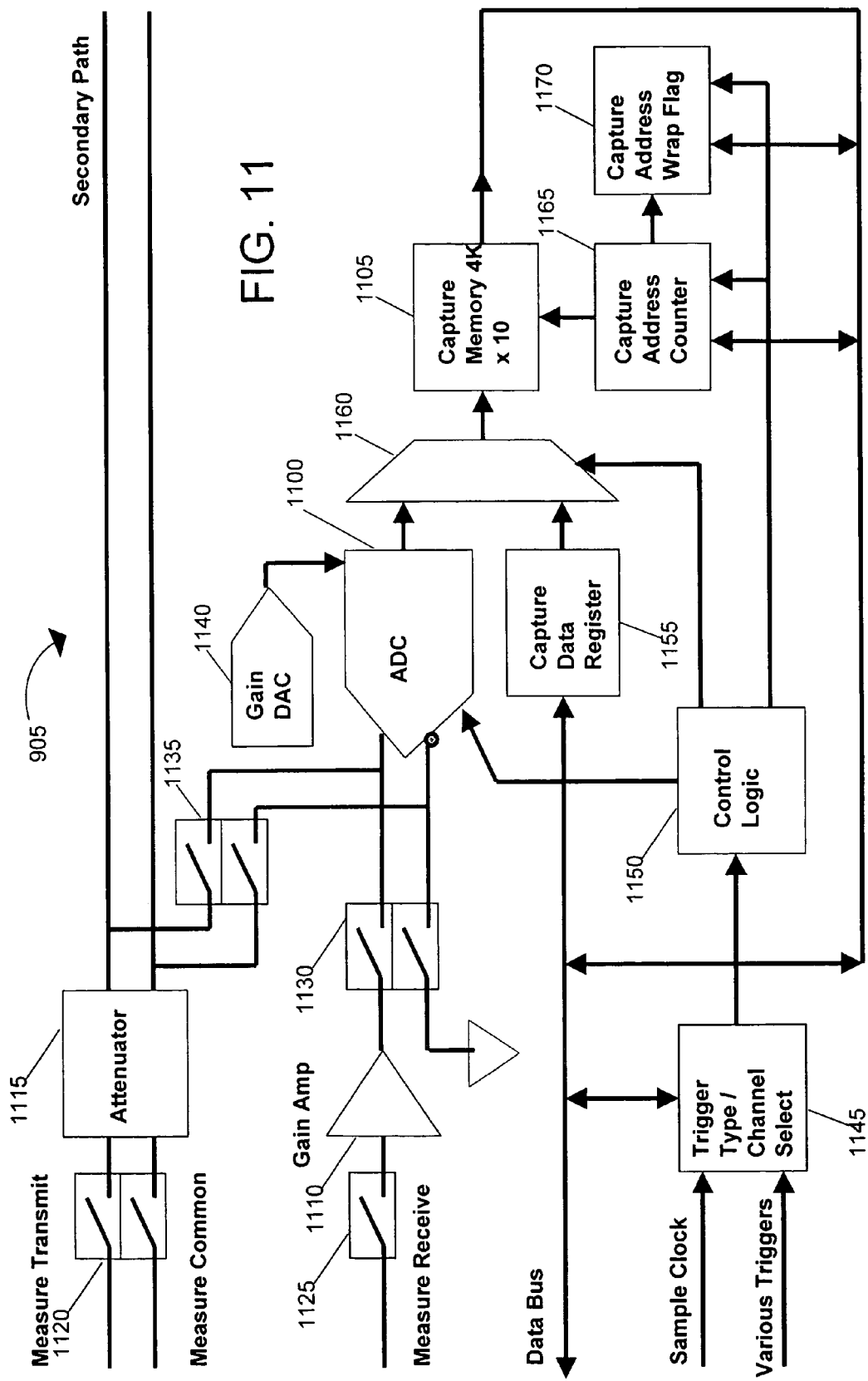
FIG. 11 shows an exemplary schematic diagram of a capture instrument included in the common system resources of FIG. 9.

Capture instrument 905 is shown in more detail in FIG. 11. Capture instrument 905 includes ADC 1100, input conditioning, and 4096 words of capture memory in capture memory 1105. ADC 1100 is a 10-bit ADC with a 2Vpp input range. The receiver input can be connected via differential gain amp 1110 which provides a 4:1 gain. The transmitter can be connected via differential attenuator 1115 with an 8:1 attenuation. ADC 1100 is clocked by MSPC clock module 775 (FIG. 7), and therefore has significant flexibility. ADC 1100 will operate from the lowest clock module frequency up to 8 MHz. ADC 1100 can be triggered by the digital vector system (not shown), by the computer, or by the TSM, RSM, TDM, or RDM.

Software from SCA software environment 115 (FIG. 1) reads capture memory 1105 and formats the contents into a standard waveform object. This object can be manipulated by DSP functions (via the API) or can be loaded into a Mixed Signal Wave Tool ("MSWT") for display or manual manipulation. Calibration software compensates for any variation in circuit performance.

Figure 12:
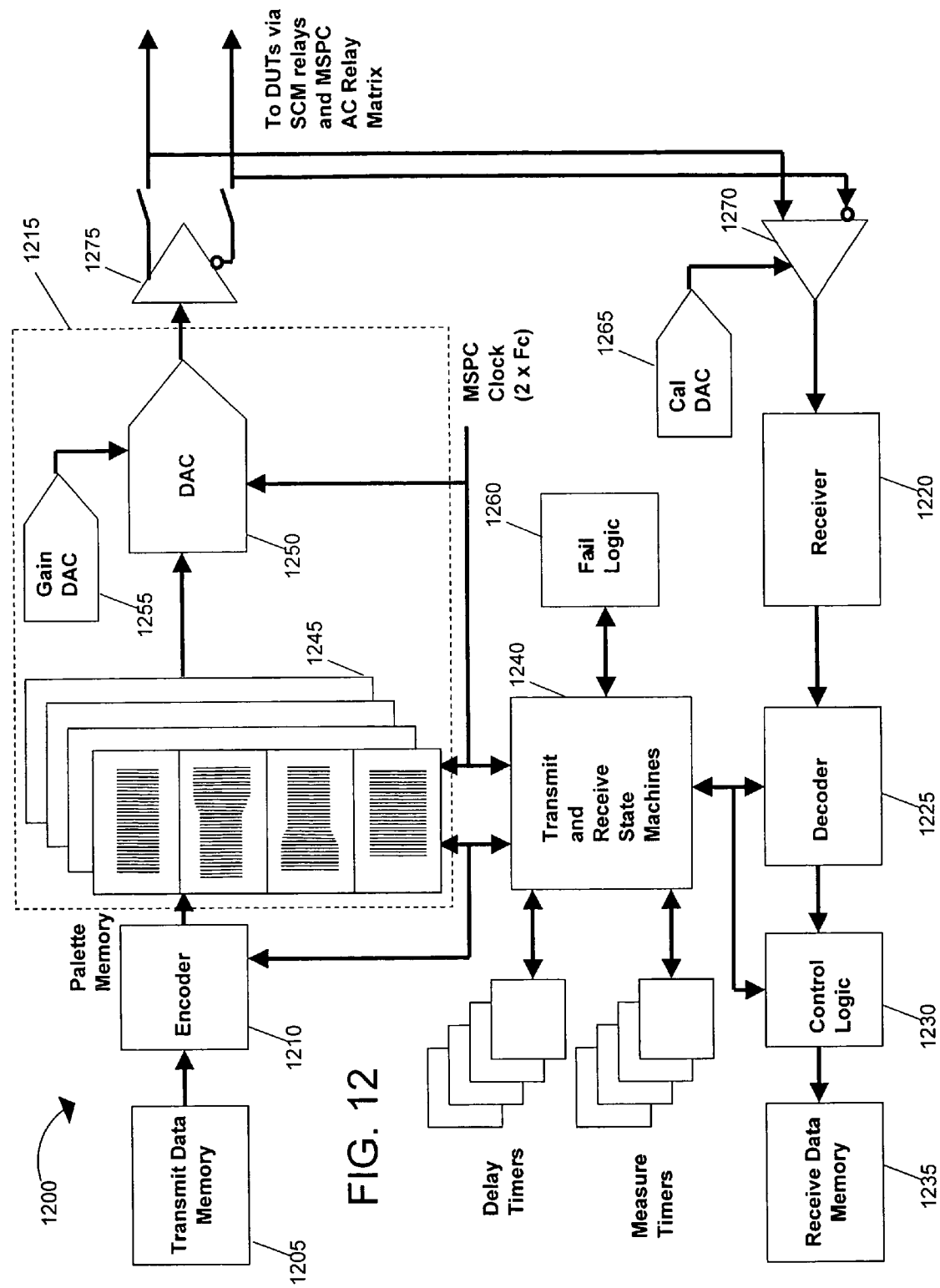
FIG. 12 shows an exemplary schematic diagram of the architecture of a Smart Card Instrument channel for use in the Smart Card Module of FIG. 8.

Referring now to FIG. 12, the architecture of an SCI is described. Each SCI (represented by SCI 1200) includes an RF transceiver, memory, and control logic. The transmit and receive side of SCI 1200 are independent, have different implementations, and therefore are discussed separately. On the transmit side, SCI 1200 includes Transmit Data Memory ("TDM") 1205, encoder 1210, modulator 1215, and power amplifier 1275. On the receive side, SCI 1200 includes receiver 1220, decoder 1225, control logic 1230, and Receive Data Memory ("RDM") 1235.

Figure 13:
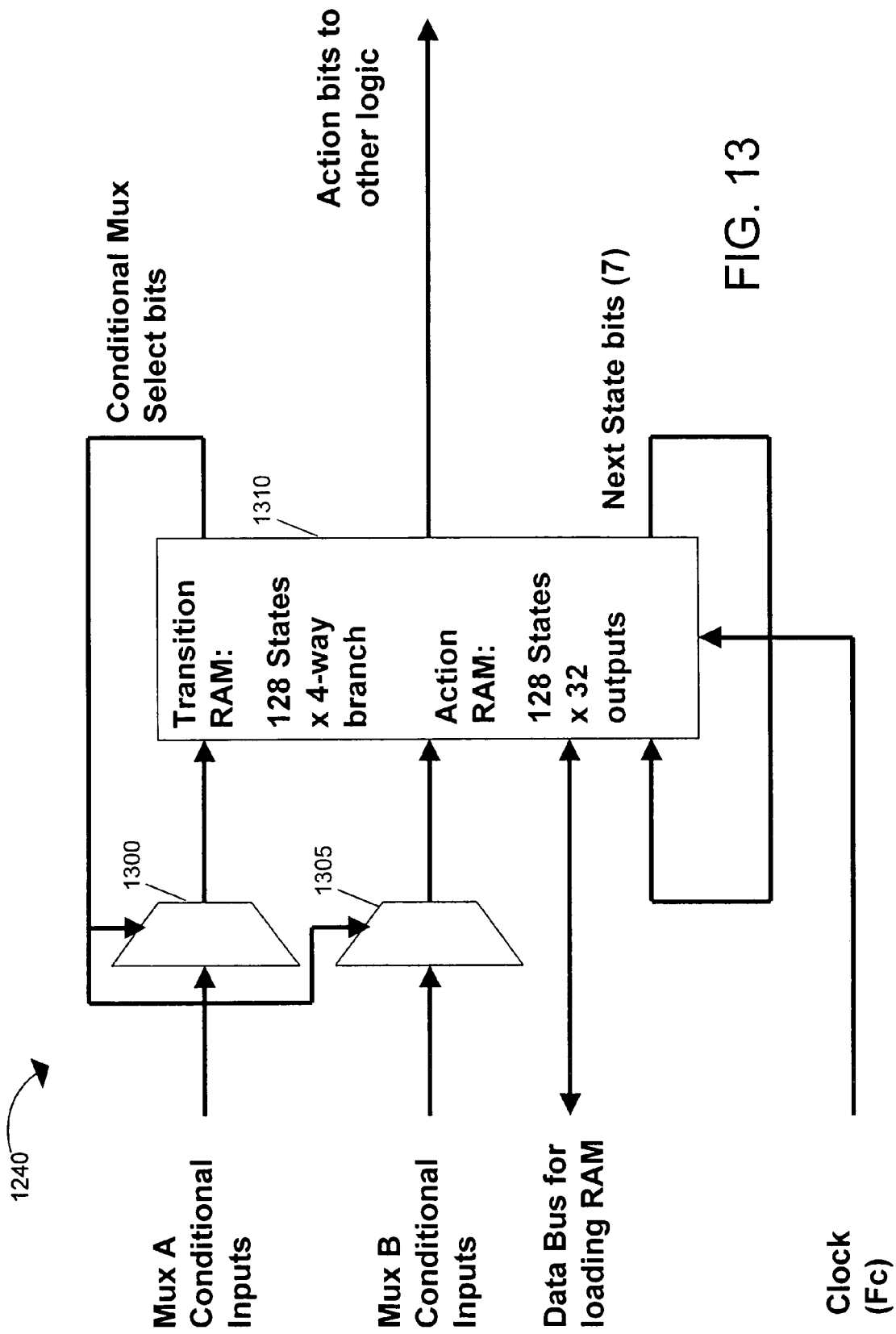
FIG. 13 shows an exemplary schematic diagram of programmable transmit and receive state machines for use in the SCI shown in FIG. 12.

SCI 1200 also includes transmit and receive state machines 1240, shown in more detail in FIG. 13, to coordinate the encoding, decoding, and protocol execution tasks. Each state machine sequences through a series of states. Each state may branch to any one of four other states, as determined by two branch condition inputs. Each branch condition input has a multiple input multiplexer ("mux"), such as mux 1300 and 1305, which allows one of several different hardware events to be used in determining when to branch in transition RAM 1310. The mux selection is specified for each state, and each state can activate or deactivate multiple output signals or actions.

The state machines may be fully programmable by a test engineer. For each state, the conditional mux selections, next state, and action outputs may be programmed by the user. A Protocol State Compiler ("PSC") in SCA software environment 115 (FIG. 1) provides a symbolic method of defining each state, and then compiling the state definitions into the appropriate data to load into the state machine. There are two instances of the programmable state machine design: the Transmit State Machine ("TSM") and the Receive State Machine ("RSM"), discussed in more detail herein below.

SCI Transmitter

The transmit side of SCI 1200 takes stored frame data, encodes the data into the digital representation specified by the protocol with encoder 1205, and then modulates the RF carrier with the encoded data with a unique and novel modulator (modulator 1010). A feature of modulator 1215 is the "Palette Waveform" modulation technique. Essentially, each transmit frame data bit is used to pick a waveform from a selection or a "palette"). This waveform represents the transition between data bits, and is stored as a digitized record in a memory. Different palettes, also referred to herein as "banks," may be selected to allow real-time modification of various RF parameters such as modulation depth or transition shape.

Figure 14:
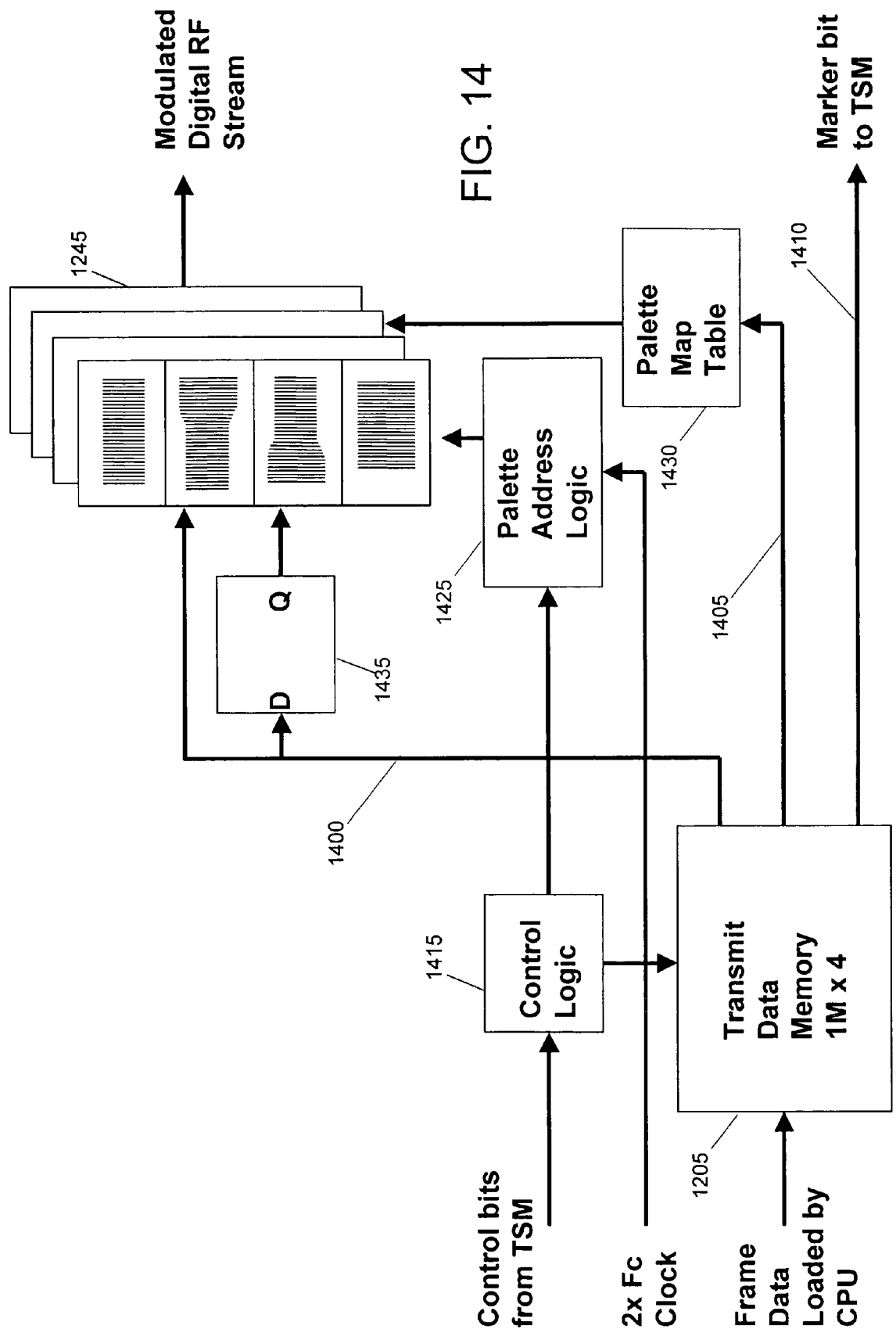
FIG. 14 shows an exemplary schematic diagram of a transmit data memory for use in the Smart Card Instrument channel of FIG. 12.

A Data Stream Compiler ("DSC") in SCA software environment 115 (FIG. 1) takes user specified symbolic data and generates values to load into TDM 1205. TDM 1205, as shown in more detail in FIG. 14, is 4 bits wide by one million addresses deep. Each address corresponds to one data bit within a Frame. The four bits within an address are split into one transmit data bit (1400) to transmit to an SCD coupled to SCI 1200, two bits for a palette bank selection (1405) to specify one of four different waveform banks, and one marker bit (1410) for marking a particular place in the data stream, for use by the TSM. This marker bit typically marks the last bit within a symbol.

Modulation in SCI 1200 makes use of stored "palette" waveforms that correspond to the transitions between bit values. These waveforms are sampled at twice the carrier frequency, and therefore contain both the carrier and the modulation. This mechanism allows complete user flexibility in modeling overshoot, undershoot, modulation depth, and other RF waveform characteristics. These sampled, digital representations of waveforms are applied to RF DAC 1250 (FIG. 12), which directly synthesizes the waveform to be applied to the SCD coupled to SCI 1200. Modulator 1215 is described in more detail herein below.

The waveform to apply is chosen by a simple hard-wired state machine, that is, encoder 1210. In the case of an ISO 14443 type-B smart card compliant device, encoder 1210 looks at the current and prior data bits to determine what transition waveform to select. Details of the transmission protocol are managed by the TSM, which provides various signals that sequence modulator 1215 to apply the appropriate waveform signals to RF DAC 1250. The output of DAC 1250 is applied to a filter which removes harmonics. This signal is sent to power amplifier 1275 (FIG. 12), which provides an amplified RF signal that drives the SCD coupled to SCI 1200.

Frames are generated using the DSC in SCA software environment 115 (FIG. 1). This software package allows the user to specify symbolic names for the various units of data and protocol overhead that comprise a frame. The PSC in SCA software environment 115 (FIG. 1) is used to specify the sequence of events required by a protocol executed by the TSM. The values loaded into the programmable delay elements are specified by API functions or a GUI tool. The modulated waveform shape is specified with a Mixed Signal Wave Tool ("MSWT"). The test engineer specifies these tests via API functions and GUI tools.

SCI Receiver

Figure 15:
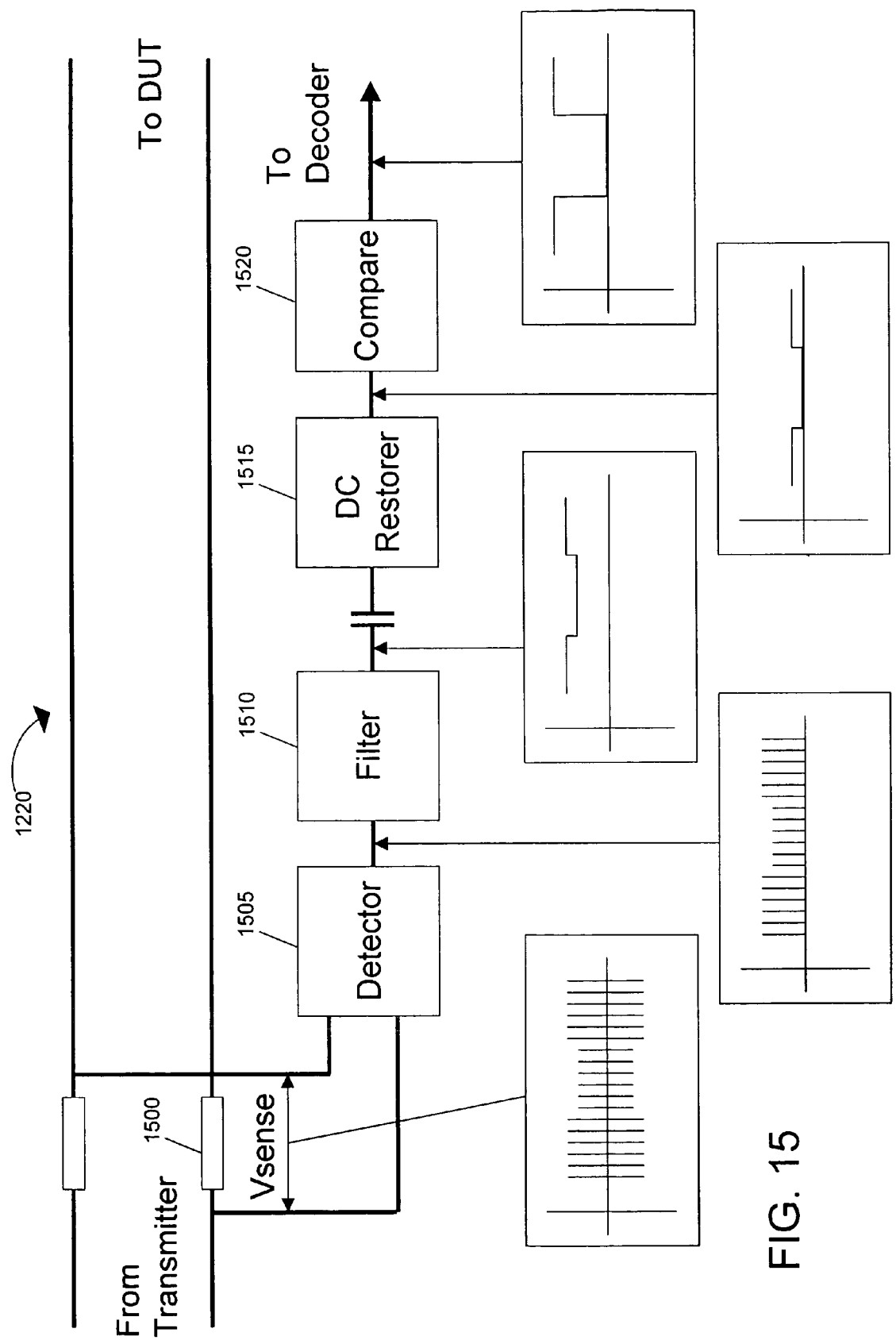
FIG. 15 shows an exemplary schematic diagram of a receiver for use in the Smart Card Instrument channel of FIG. 12.

An exemplary schematic diagram of SCI receiver 1220 is shown in FIG. 15. Receiver 1220 includes Vsense resistor 1500, across which the signal from the SCD coupled to SCI 1200 initially appears. This signal is detected by detector 1505 and filtered by filter 1510 to remove its carrier and sub-carrier components. The remaining modulation is AC coupled to DC-restore circuit 1515, and then compared to a known threshold by comparator 1520.

This results in a signal at standard logic-levels that is then decoded by a hard-wired state machine, decoder 1225 (FIG. 12). In conjunction with decoder 1225, the RSM in state machine 1240 provides timer resources and branching capability to perform a real-time transformation of the modulated sub-carrier signal into a decoded bit-stream. This bit-stream is analyzed by the RSM to ensure it adheres to the defined protocol. The bit-stream is also compared in real-time to the contents of RDM 1235.

Figure 16:
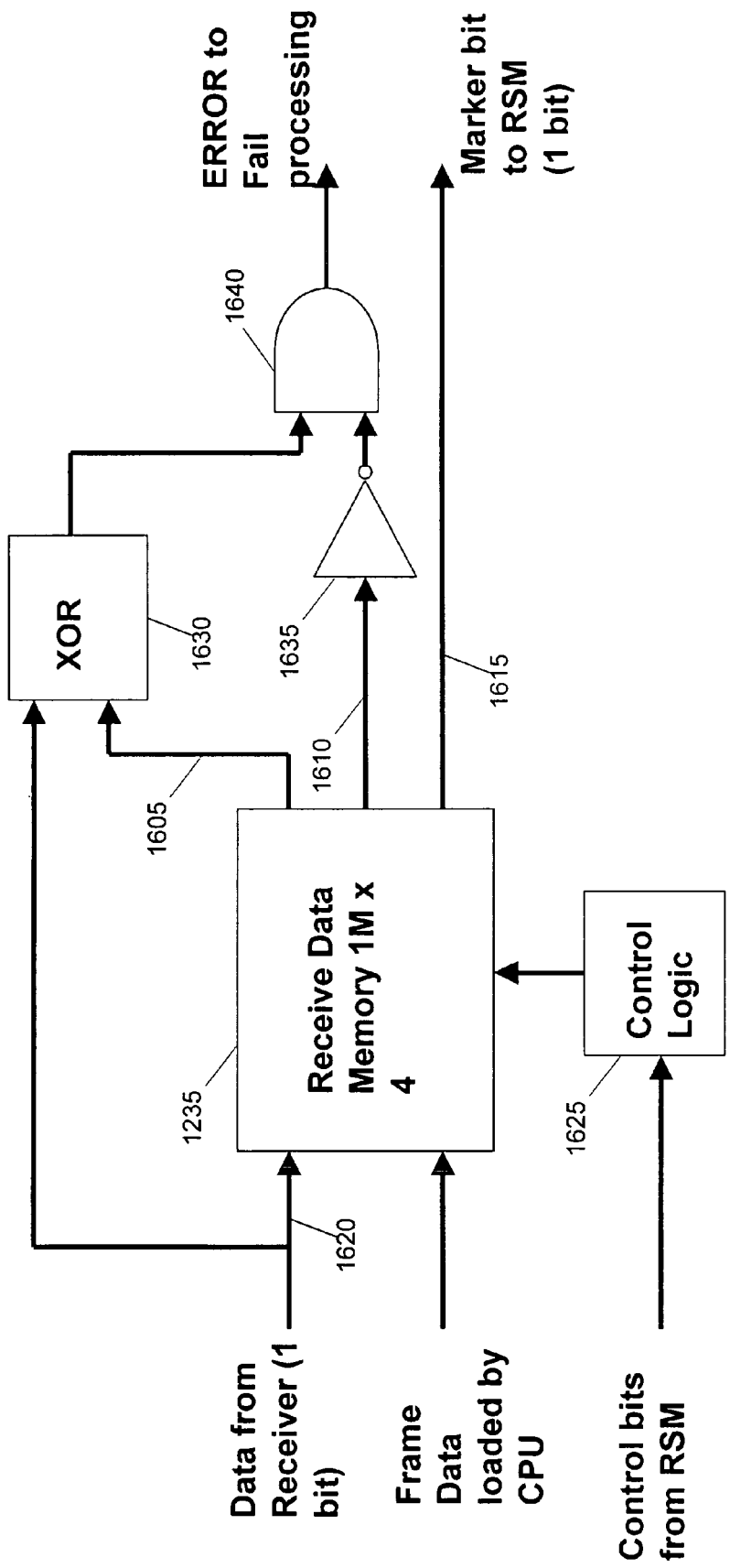
FIG. 16 shows an exemplary schematic diagram of a receiver data memory for use in the Smart Card Instrument of FIG. 12.

RDM 1235, shown in more detail in FIG. 16, is 4 bits wide by 1 million addresses deep. Each address contains the 4 bits that make up a received data value, split into one expect data bit 1605 representing the expected value of the received data bit, one mask data bit 1610 representing a marker for "don't care" bits that are not compared against the received data stream, a marker bit 1615 for marking a particular place in the data stream, for use by the RSM, and a received data bit 1620 for the actual data received by SCI 1200. Marker bit 1615 typically marks the last bit within a symbol.

Similar to the transmit portion of SCI 1200, the PSC translates a state description of the receive protocol into the correct data to load into the RSM. The DSC takes a symbolic definition of the expected receive data, and translates it into the values to load into RDM 1235, as shown in FIG. 16.

The DSC generates a file that contains the expect, mask, and marker bits for every data value specified in the user's input text file. This file is loaded into RDM 1235 in preparation for executing an RF functional test. The received data bit is loaded into RDM 1235 during test execution time, as each bit is received from the SCD coupled to SCI 1200. Each received bit is compared in real time against its corresponding expect and mask bits. If an unmasked received bit mismatches the expect data bit, an error has been detected, and appropriate actions are taken.

SCM Connection Relays

Each SCI in a SCM, such as SCIs 815, 820, 825, and 830 in SCM 800 shown in FIG. 8, is connected to its associated interface signals and to the common resources in the SCM, such as common resources 810 shown in FIG. 8, via a relay matrix. In some cases, signals from the common resources in the SCM must be routed to or from other portions of the MSPC board while one SCI is in use. This is done by "stealing" the matrix connections from some other SCI such that the other three SCI are idle during shared instrument use. This technique is used to connect an SCI signal through an attenuator to an ACI in an adjacent module slot. This is also used to connect an MSPC bias supply to the capacitance instrument, through an isolation choke.

Figure 17:
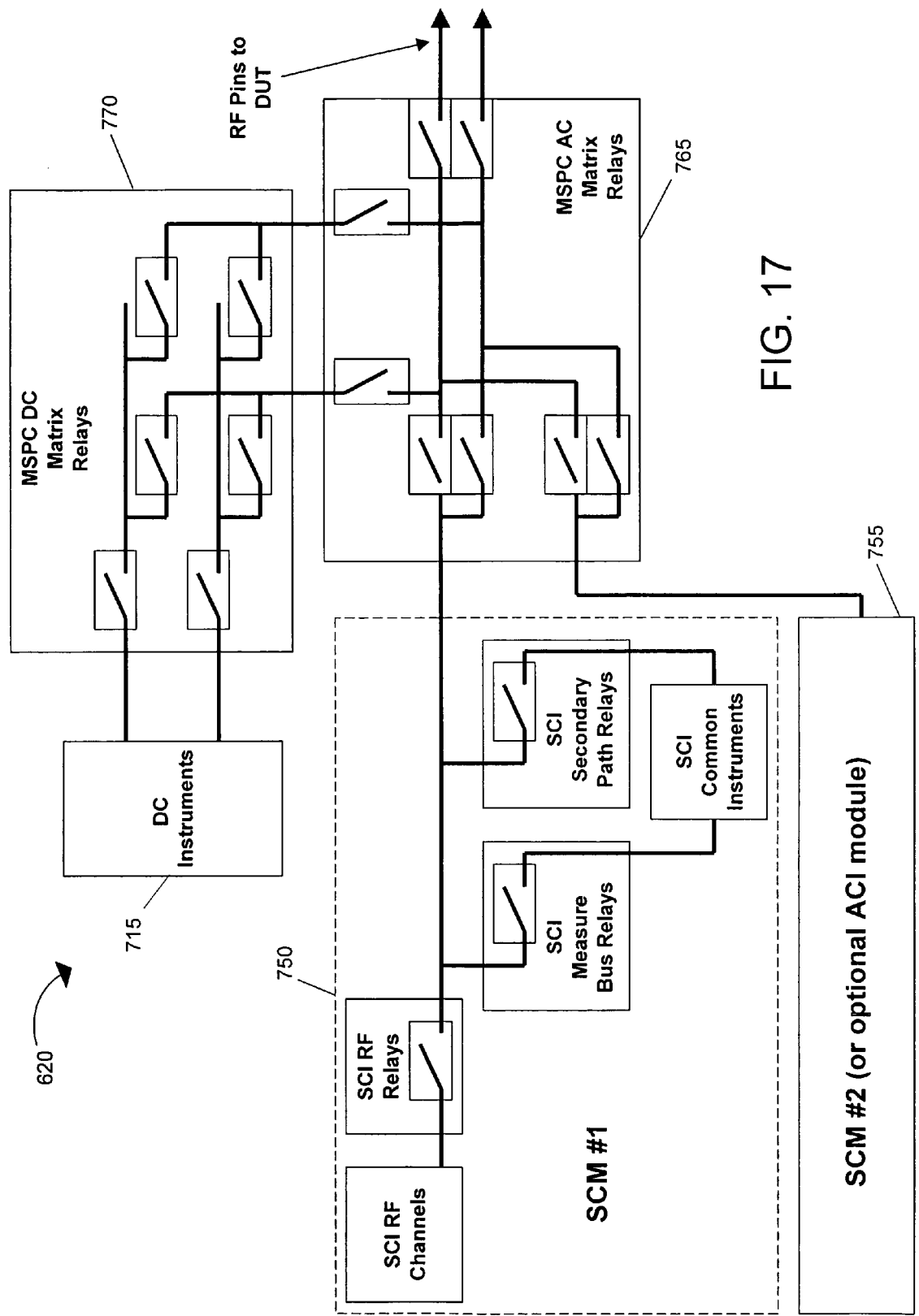
FIG. 17 shows an exemplary schematic diagram of relay groups on the Mixed Signal Pin Card board of FIG. 7 and the Smart Card Module of FIG. 8.

FIG. 17 illustrates the various relay groups in the MSPC board and in the SCM included therein, such as MSPC board 620 (FIG. 7) and SCM 800 (FIG. 8), and how they provide the paths between various resources. It should be understood by one of ordinary skill in the art that the relays are shown for illustration purposes only and space limitations in FIG. 17 may force some compromises in the drawing. For example, although some paths may contain 4, 8 or 16 signals, only one or two lines and relays may represent the paths. Also, the RF paths are differential, but are shown as single-ended.

Figure 18:
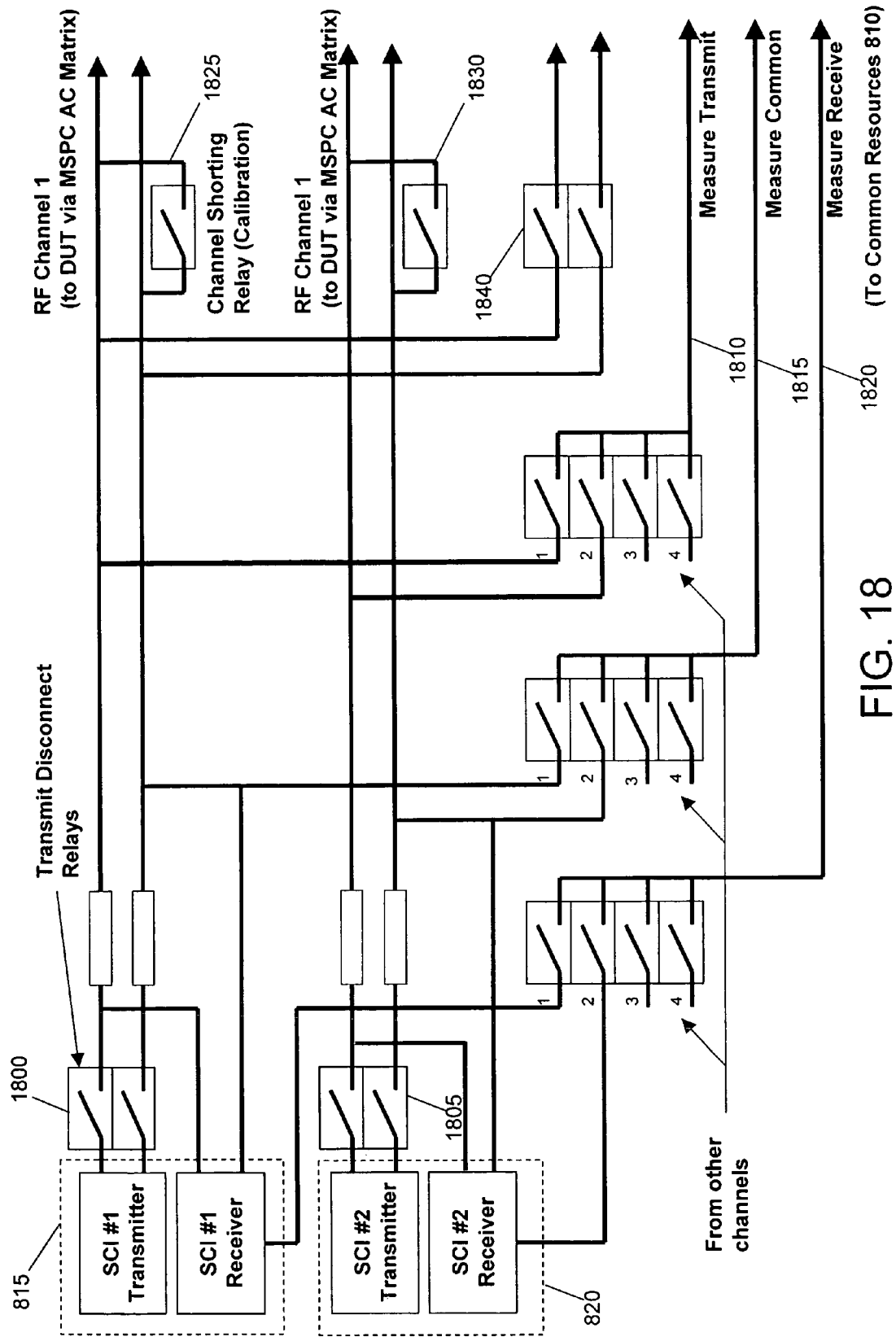
FIG. 18 shows an exemplary schematic diagram of the RF channel paths and relays in the Smart Card Module of FIG. 8.

FIG. 18 details the RF channel paths on the SCM, such as SCM 800 (FIG. 8). Only two of four SCI's, such as SCI 815 and SCI 820, are shown. Each SCI has a pair of relays (1800 and 1805) which disconnect the SCI transmitter from the RF channel pins. There are three measurement buses which can be independently connected to each SCI. These buses are: (1) "Measure Transmit" bus 1810, for the "high" side of the transmitter output; (2) "Measure Receive" bus 1820, for the "high" side of the receiver input; and (3) "Measure Common" bus 1815, for the "low" or common side of both the transmitter output and receiver input. These busses go to the SCM's common resources, such as common resources 810 in SCM 800 (FIG. 8), to allow each RF channel to connect to the various shared instruments.

Each SCI also has a relay that shorts the RF channel, for calibration purposes, such as relay 1825 for SCI 815 and relay 1830 for SCI 820. Finally, there are two pairs of relays, "Secondary Path" 1840, that allow "stealing" SCI#1 (815) or SCI#4 (830) matrix connections to allow connections between common system resources 810 and other MSPC resources via MSPC AC Matrix 765.

Figure 19:
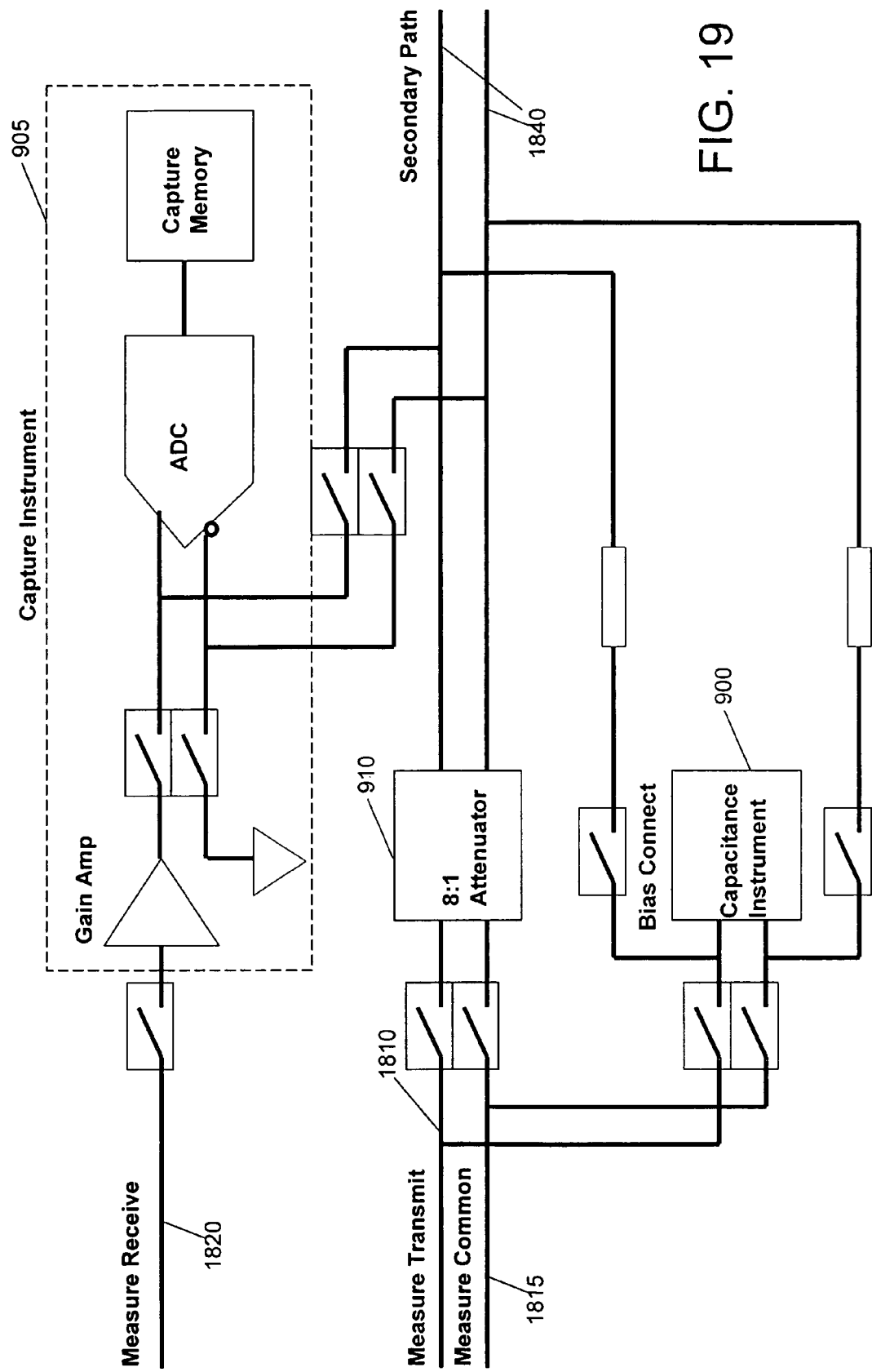
FIG. 19 shows an exemplary schematic diagram of the relay matrix used for the common system resources in the Smart Card Module of FIG. 8.

The common resources in the SCM, such as common resources 810 in SCM 800, also have their own relay matrix, as shown in FIG. 19. Measure transmit bus 1810 can connect to either capacitance instrument 900 or attenuator 910. The output of attenuator 910 connects to the ACI (such as ACI 750 or 755 shown in FIG. 7) via secondary path 1840, using either SCI#1 or SCI#4 connections. Likewise, a bias supply, such as bias supplies 725, 730, 735, and 740 shown in FIG. 7, can provide a DC offset for capacitance instrument 900 via secondary path 1840.

Measure receive bus 1820 connects to ADC 1100 in capture instrument 905 via differential gain amplifier 1110 (FIG. 11). ADC 1100 can also connect to measure transmit bus 1810, via attenuator 910. Although capture instrument 905 cannot perform full speed capture of the SCI's carrier, it can determine some carrier characteristics (like amplitude) by under-sampling. This is necessary for system calibration.

SCI Modulator

The transmit half of each SCI includes a large memory for storage of frame data (TDM 1205) and an RF transmitter, which includes modulator 1215 and power amplifier 1275 shown in FIG. 12. Modulator 1215 uses a novel "palette waveform" technique to encode and generate the signal that is transmitted to each DUT, that is, to DUTs 540 shown in FIG. 5.

In general, to transmit information on an RF link, the digital data to be sent is first encoded into symbols, and then the symbols are modulated onto the RF carrier. This signal is then amplified and sent to the antenna or other interface. In the case of SCA 110 (FIG. 1), there is no antenna, just contacts to the RF pads in each SCD.

SCA 110 is optimized to test proximity cards as defined in the ISO standard 14443. These cards are formally called Proximity Integrated Circuit Cards ("PICC"). A corresponding reader device is called the Proximity Coupling Device ("PCD"). In the case of SCA 110, each DUT is a PICC, and each SCI RF channel is a PCD. PCDs and PICCs communicate via an RF communications channel, using a layered protocol that packages data into frames. Communication is half-duplex, typically with the PCD as the master device that initiates communications by sending a frame. PICCs respond with a frame. This back-and-forth activity continues until communication terminates.

All smart cards share a common physical layer RF protocol. The PCD transmits an RF carrier at 13.56 MHz. This carrier serves several purposes, namely: (1) it is modulated with the data destined for the PICC; (2) the PICC derives its power supply by rectifying and storing the received carrier energy ("tele-power"); and (3) the PICC modulates this RF carrier with its own sub-carrier at 847 kHz. This sub-carrier is modulated by the PICC with data destined for the PCD (retro-modulation).

The next protocol layer determines how bits are represented in the modulated RF stream. Note that there are several protocols in common use. In each case, the protocol specifies how zero's and one's are sent between the PCD and PICC in each direction. The next protocol level describes how bits are combined into symbols. Some symbols are required "packaging" or overhead used to establish and maintain the communications link. Others are the actual data contained by the frame. Note that there may be delays between symbols and other events. Higher levels of the protocol define how a system of PICCs and PCDs resolves communication errors and collisions when multiple cards respond at the same time. Yet higher levels handle multi-Frame transactions.

In all cases, a protocol layer can be represented by a series of "events" that occur in a defined sequence and have a known temporal relationship. Events may include the change in value of a signal, or the expiration of a timer. A sequence specifies the order in which events should occur. Temporal relationships specify the time between events, usually in the form of a minimum/maximum acceptable duration window. If a protocol event, sequence or time window is incorrect, an error has occurred. Some errors are recoverable, some are not.

RF smart card test involves both functional and parametric tests. Functional testing includes sending a known message to the smart card, and receiving a response therefrom. Note that a correct response not only matches bit-for-bit with the expected response, it should also have various event times within the correct minimum and maximum delay windows. Both transmit and receive frames may be specified by a test engineer. The test engineer also provides details about the events that make up a protocol, and the sequencing and timing of these events. These details are specified by the modulated waveform shape, the values in programmable delay elements, and the sequence of events as specified by a state machine. In functional testing, only a pass/fail result is obtained, although information about the type of failure is provided.

Parametric testing involves measuring various parameters, and comparing the measurements against specified limits, or saving the measured value for further analysis. Smart card parametric tests involve the measurement of PICC RF capacitance, protocol event times, and sub-carrier RF parameters. Results include measured values, or captured waveforms. Waveforms may serve as input to Digital Signal Processing ("DSP") math functions for additional analysis.

The ISO 14443 standard describes both Type-A and Type-B PCD transmitter waveforms in terms of symbols that represent bits encoded and modulated onto the 13.56 MHz carrier. In addition, an un-modulated carrier should be provided to power the PICC and provide the carrier during PICC retro-modulation. Power-up and initial communications to a PICC requires that the carrier be ramped up in a controlled fashion to the desired power level, rather than just "switched on." Likewise, PICC RF communications and power-down should end with ramping down the carrier power.

The ISO 14443 standard describes the symbols used for both Type A and Type B PCD transmission as amplitude modulation of a 13.56 MHz carrier. The un-modulated carrier can be considered "full amplitude." Modulation actually decreases the carrier amplitude by a defined amount from its maximum value (although there are overshoot glitches that are specified to exceed the nominal carrier maximum amplitude). The transition between symbols is defined to have a minimum and maximum slope, overshoot, and undershoot. A symbol lasts for one Elementary Time Unit ("ETU"), which includes some portion of the transition between symbols.

Figure 20B:
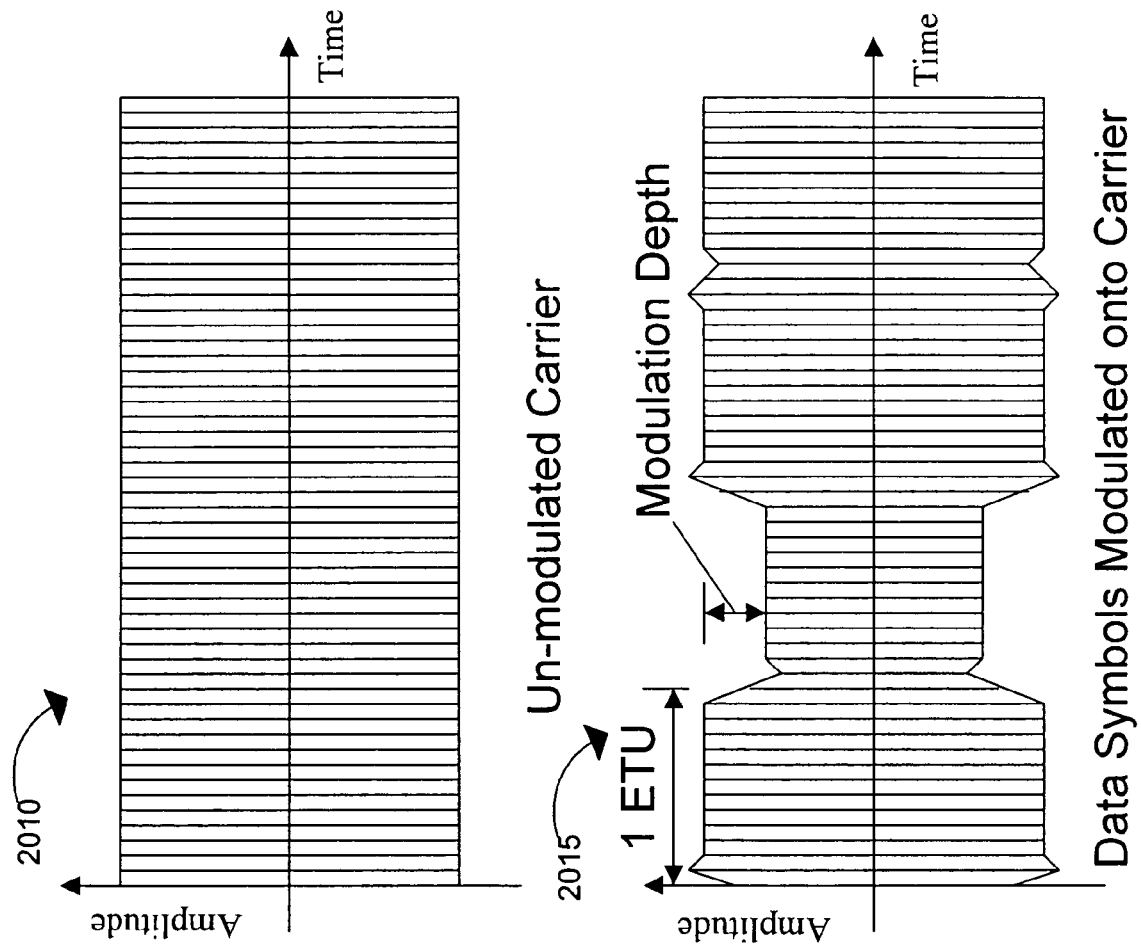

Details of the ISO 14443 RF signaling specification may be found in the ISO standard 14443-2. A simplified illustration of the Type-B modulation is shown in FIGS. 20A and 20B.

In one exemplary embodiment, SCI 1200 (FIG. 12) uses a novel technique to encode and modulate the digital data onto the RF carrier. This technique uses a mechanism akin to a mixed signal arbitrary waveform generator to create the encoded and modulated RF waveform. Essentially, the amplitude of the transitions between symbols is represented as digitized values sampled at the carrier Nyquist rate. Each symbol transition is defined to contain enough samples to span one ETU period.

Each of these digitized transitions (known as a "Palette Waveform") are pre-stored in a memory (Palette memory or palette RAM 1245). Since there are two data values (zero and one), there are four possible transitions (0→0, 0→1, 1→0, 1→1). Therefore, palette RAM 1245 should contain four palette waveforms. Since an ETU is defined to be 128 carrier ("Fc") cycles, sampling theory requires that the resultant waveform contains at least 256 samples. Each sample is represented digitally as a 12-bit value. FIG. 21 illustrates the sampled symbol transition. In the example shown, the 1→0 entry in palette RAM 1245 would be loaded with the digital representation of the samples (only a few samples are shown).

Figure 22:
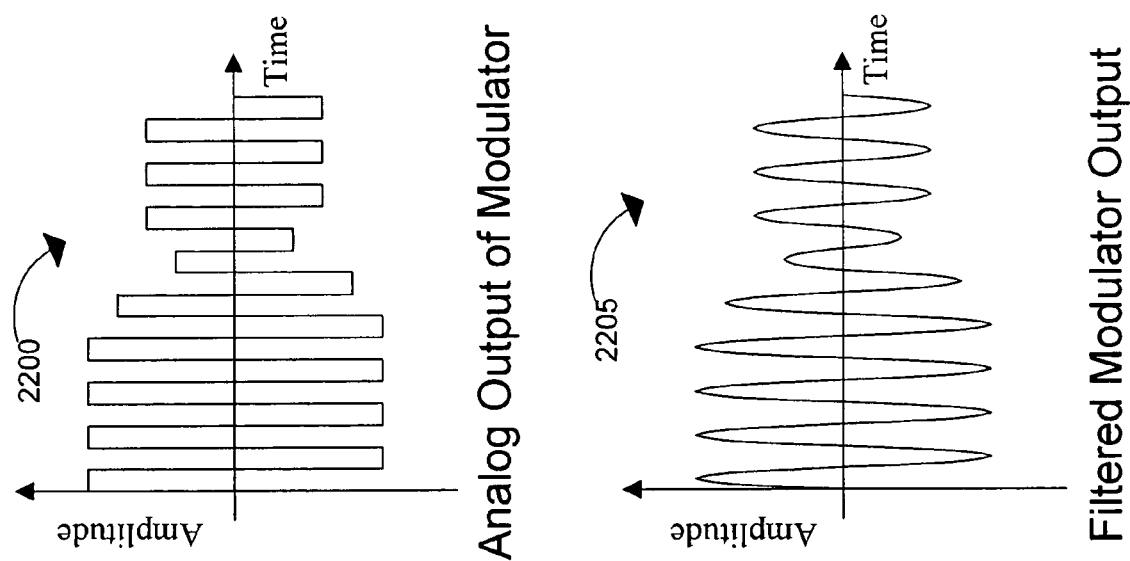
FIG. 22 illustrates the reconstruction of the sampled transition and carrier signal used by the modulator shown in FIG. 12.

During transmission, the sequence of transmit data bits is used to select a palette waveform from palette memory 1245 during each ETU period. In particular, the "current" ETU data bit, and the "prior" ETU data bit are used to select one of four possible symbol transition waveforms. The selected digitized symbol transition is then converted back into an analog signal by indexing through the selected transition waveform memory with a palette sample counter. The memory output is sent to DAC 1250, the output of which is filtered to remove harmonics, amplified, and sent to the PICC. Because the symbol is sampled at the carrier Nyquist rate, the symbol's amplitude is inherently "mixed" with the carrier frequency. Thus, reconstructing the sampled symbol transition at the carrier Nyquist rate generates the amplitude modulated carrier. FIG. 22 illustrates the reconstruction of the sampled transition and carrier.

Figure 23:
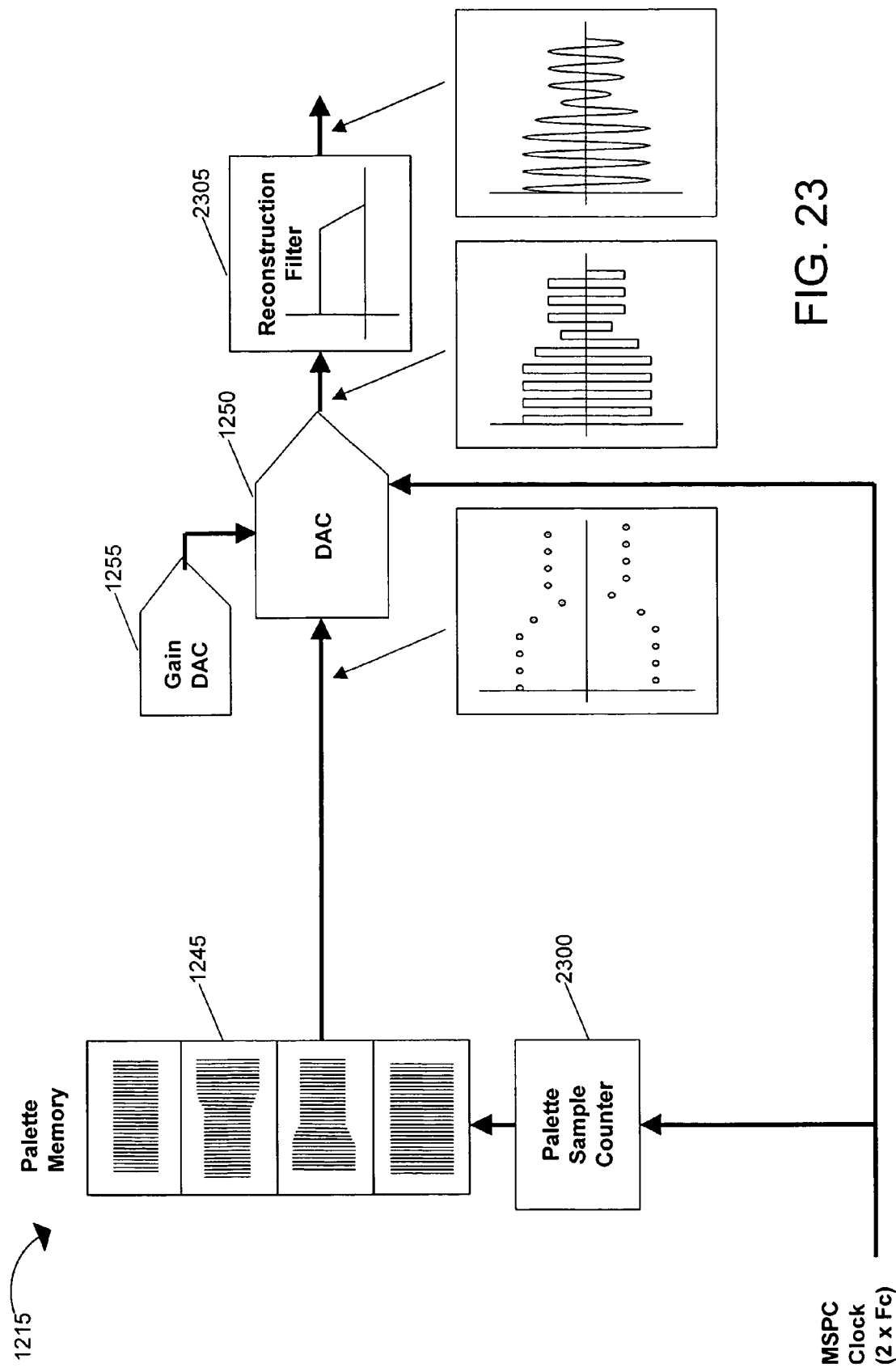
FIG. 23 shows a schematic diagram of an exemplary embodiment of the modulator shown in FIG. 12.
Figure 24:
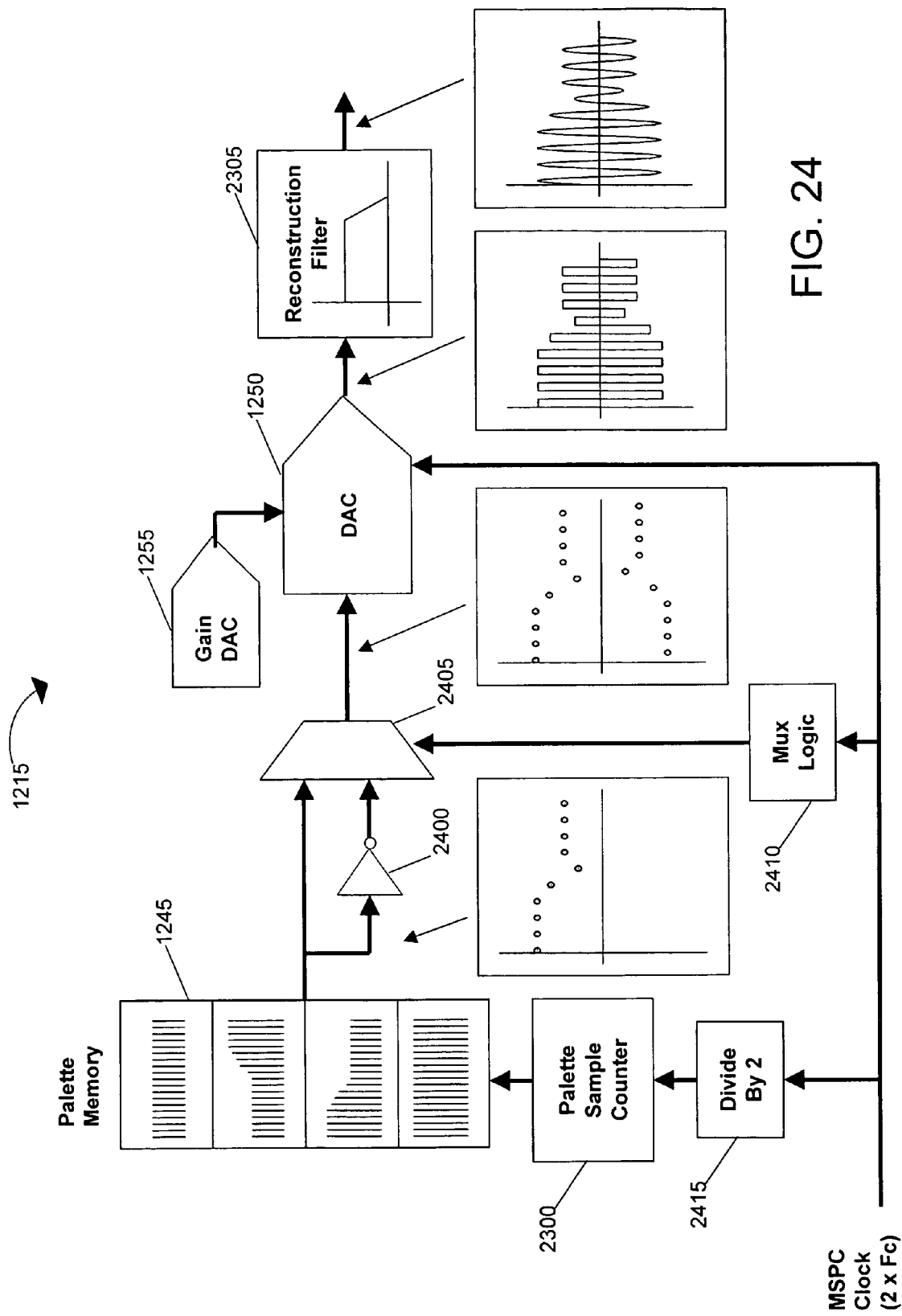
FIG. 24 shows a schematic diagram of another exemplary embodiment of the modulator shown in FIG. 12.

FIG. 23 shows a schematic diagram of an exemplary embodiment of modulator 1215 running at 2×Fc with palette sample counter 2300 and reconstruction filter 2305. However, a clever technique can allow the majority of the circuitry to run slower and at the same time reduce the required size of palette memory 1245. It is advantageous to consider that the transmitted signal is actually symmetrical (or almost so) around its midpoint. Therefore, only the "positive" side of the signal in palette memory 1245 needs to be stored, if the stored value is digitally inverted on alternate Fc half cycles. This can be done in a manner illustrated in FIG. 24. Note that the output of palette memory 1245 is a bus, and thus inverter 2400 connected to mux 2405 is actually an inverter for each bus line.

Figure 25:
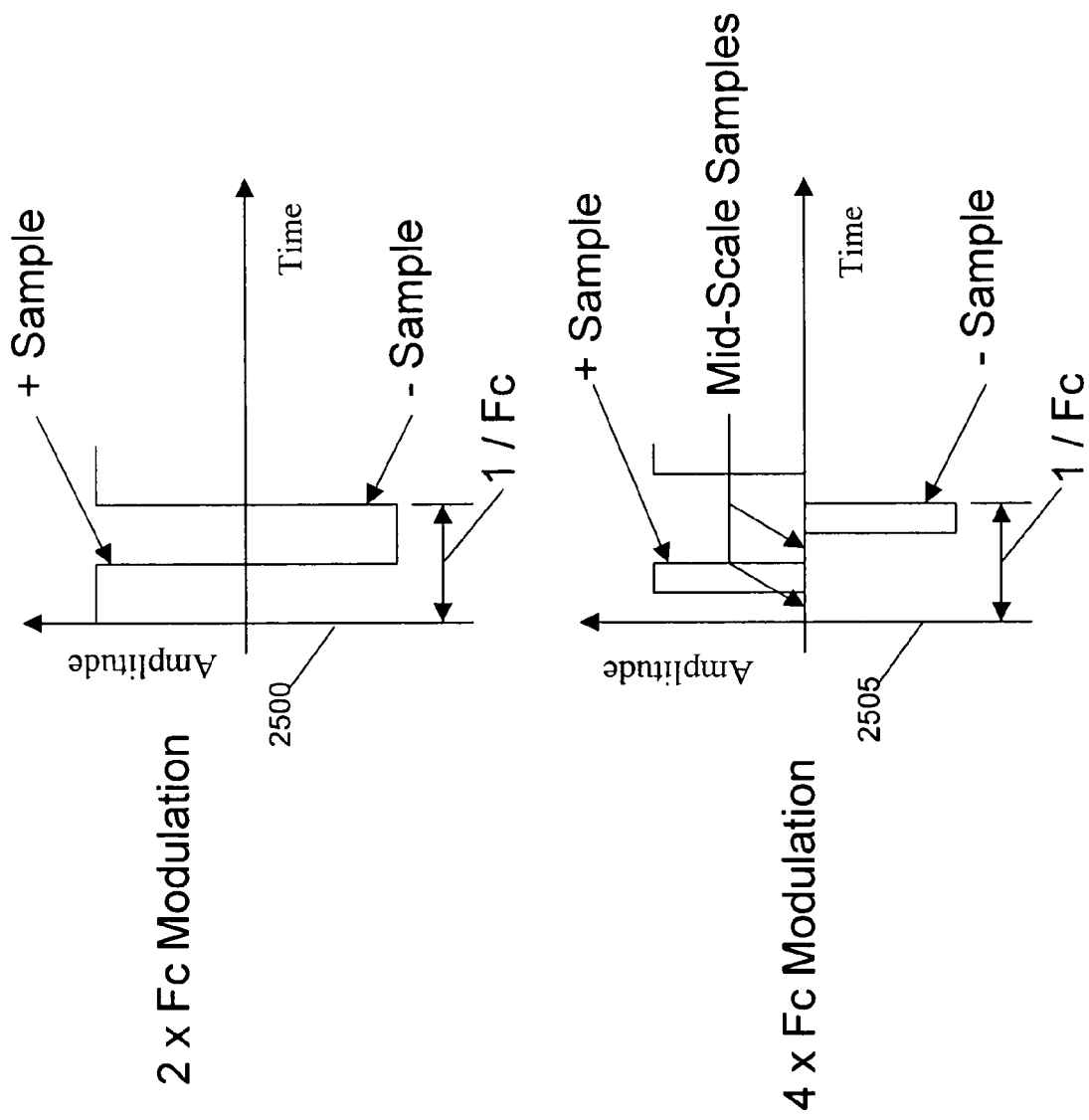
FIG. 25 illustrates exemplary modulation waveforms for use with the modulator shown in FIG. 24.

Another improvement can be made by introducing two mid-scale samples for each Fc cycle, as shown in FIG. 25. This is easy to implement, as the mid-scale digital value is a fixed code, which can be inserted into the digital data by running palette output mux 2405 twice as fast (4×Fc), with two additional input selections (both mid-scale), generating four values in each Fc cycle. While this requires palette output mux 2405, its control logic 2410, and DAC 1250 to run at 4×Fc, it makes the implementation of reconstruction filter 2305 simpler and smaller, and results in a higher fidelity output signal. Each sample in palette memory 1245 is now transformed into four samples in one modulated Fc cycle.

Figure 26:
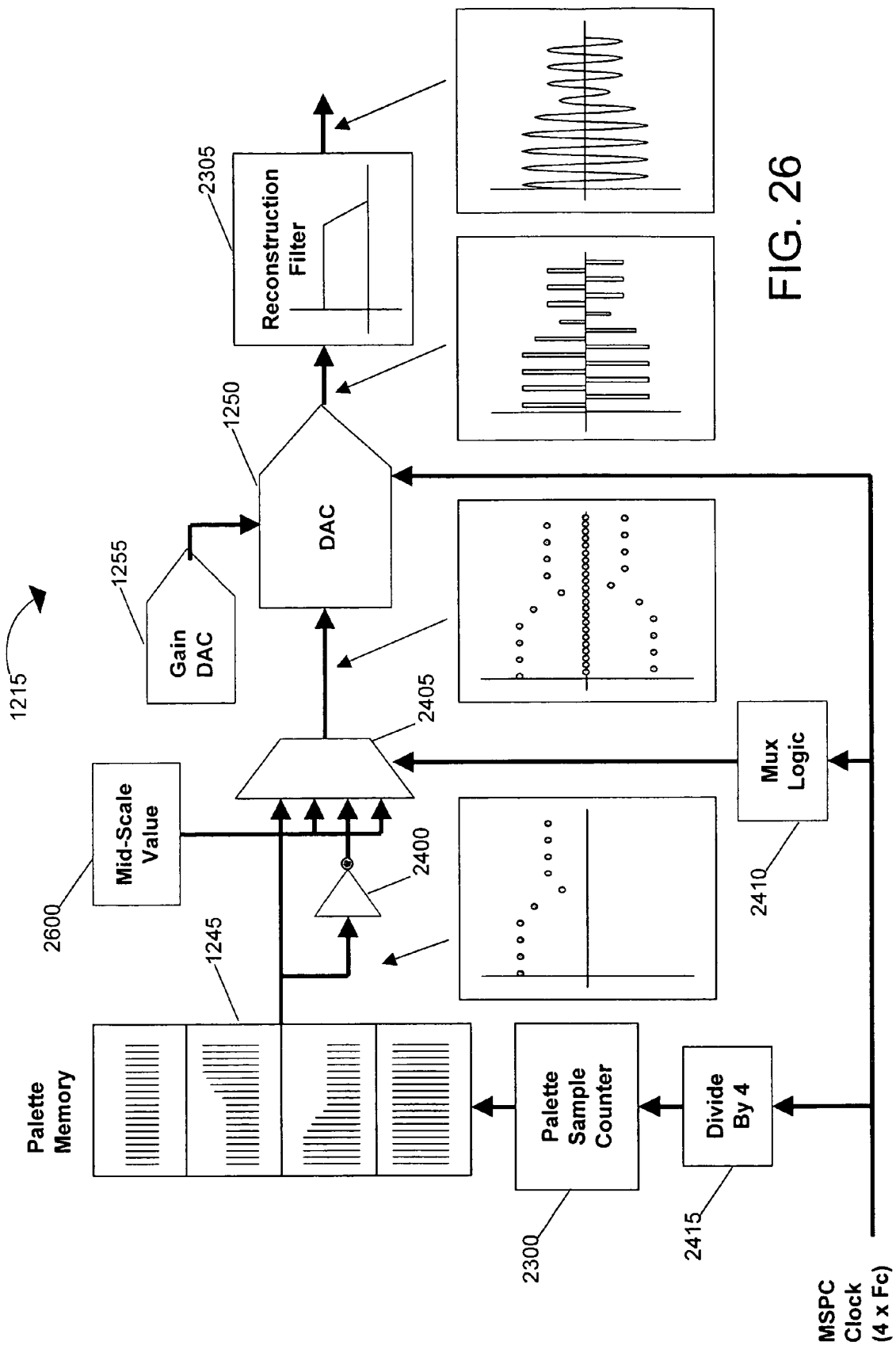
FIG. 26 shows a schematic diagram of another exemplary embodiment of the modulator shown in FIG. 12.

FIG. 26 is a block diagram illustrating the hardware changes in the modulator to support 4×Fc modulation with the addition of mid-scale value 2600.

Figure 27:
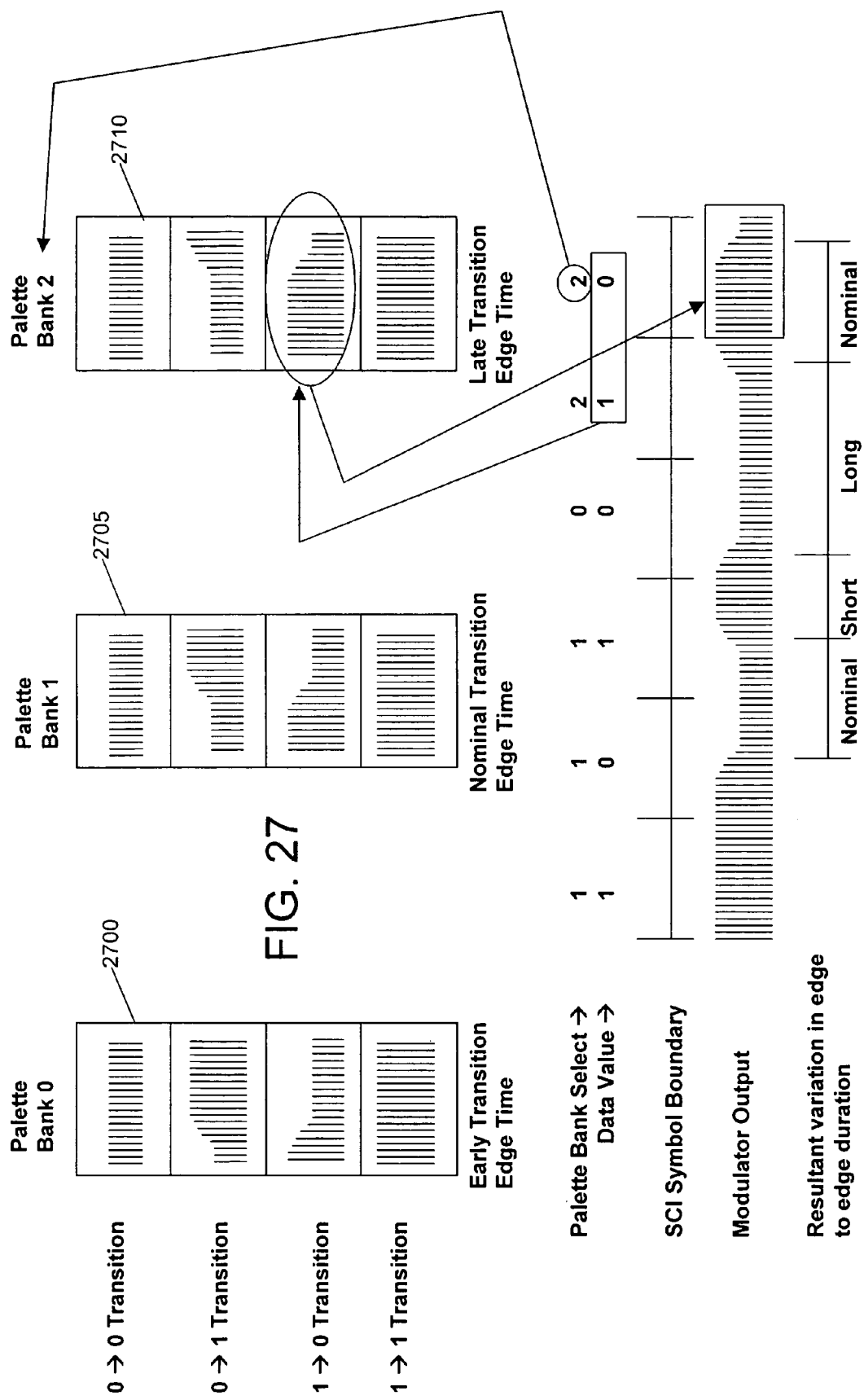
FIG. 27 illustrates transition edge placement in the palette banks used by the modulator shown in FIG. 12.

One requirement of testing ISO 14443 devices is that the time of a symbol transition should vary from ETU to ETU for some tests. This implies that the transition "edge" should come out of the modulator at different times during the same frame. SCI 1200 (FIG. 12) achieves this by providing four banks of palette memory 1245 (referred to herein as "Palette Banks"). The palette bank in use is uniquely selected during each ETU via the palette bank select bits, which are stored in TDM 1205 along with the digital data to be transmitted. By storing waveforms with different transition times in different palette banks, the effect of variable edge placement can be created by changing the palette bank select bits as needed. FIG. 27 illustrates how this works.

Figure 28:
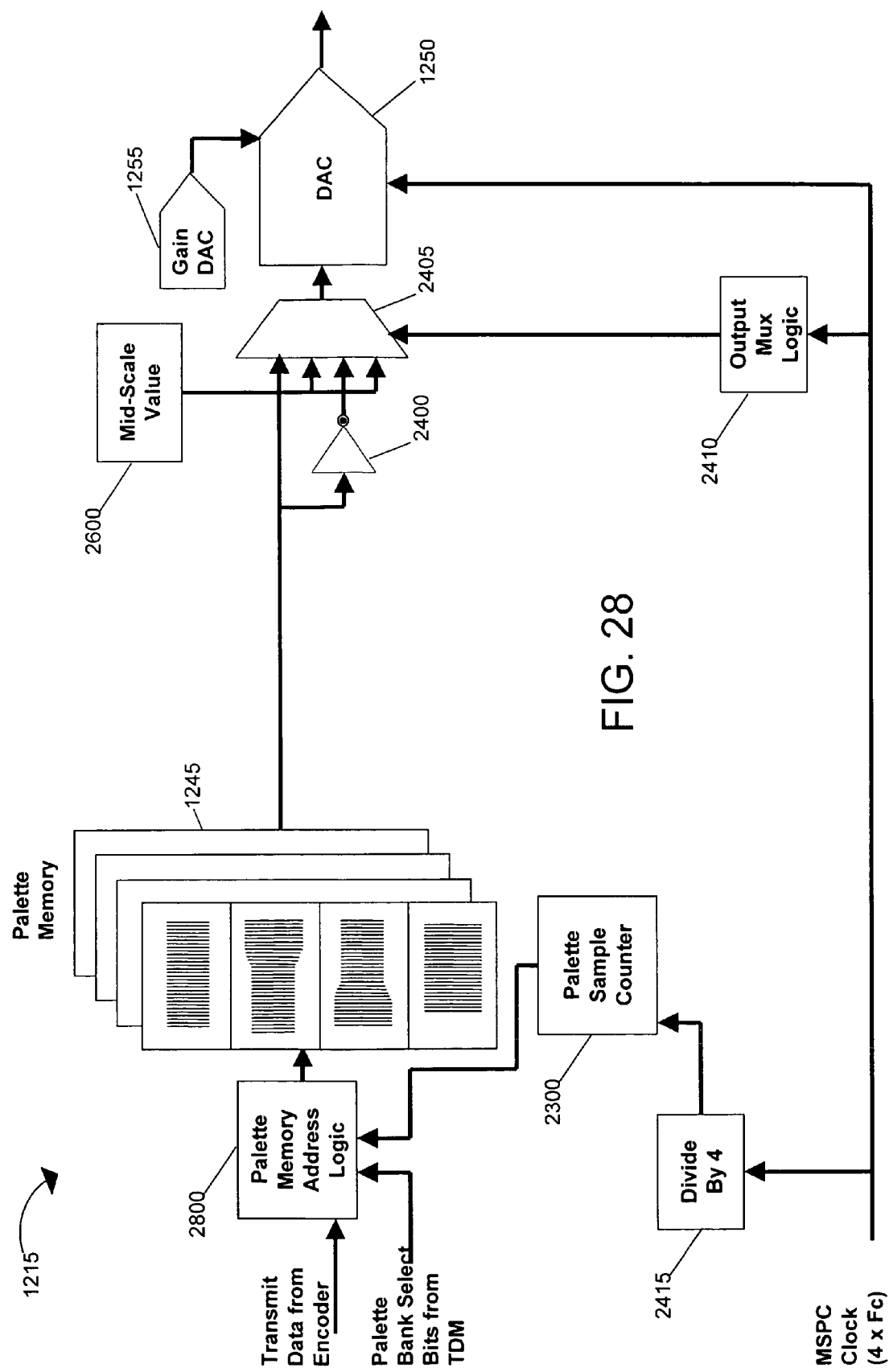
FIG. 28 shows a schematic diagram of another exemplary embodiment of the modulator shown in FIG. 12 with palette bank hardware additions.

While FIG. 27 demonstrates variable transition edge placement, the palette bank scheme may be used for other purposes that require a waveform change every ETU, independent of the provided data bit. This can include changing the transition slope, or changing intentional distortion. FIG. 28 is a block diagram of the modulator with palette memory address logic 2800 for performing the palette bank memory scheme.

As described thus far, two of the four TDM bits available per ETU are used to select the palette bank, during each ETU period. These palette bank select bits are specified in a transmit frame data file, and are compiled and loaded into TDM 1205. Since TDM 1205 and palette memory 1245 are both large and time consuming to change, a more flexible method of changing palette bank assignments is desirable. Therefore, a palette bank map may be provided, which allows an indirect binding of the palette bank select bit code to an actual palette bank. This palette bank map is essentially a simple register file that takes a two bit "virtual" palette bank select code from TDM 1205, and outputs a user programmable two-bit code to select a "physical" palette bank. Therefore, the mapping between the virtual palette bank select bit code in TDM 1205, and the physical palette bank is completely user definable. Note that this mechanism is similar to digital tester timing systems. The "mapping" from SCA terminology to traditional digital tester terminology is:

Palette Bank→Cycle Type (or Time Set)
Virtual Palette Bank→Global Cycle Type
Physical Palette Bank→Local Cycle Type
Palette Bank Map→Global to Local Translation Table As an example, one could set up palette memory 1245 as shown in the prior example, with variable edge timing waveforms using 3 of the 4 palette banks. The corresponding transmit frame would have virtual palette bank select bits specified as shown in Table I below. In this case, the mapping between TDM 1205 virtual palette bank select bits and the physical palette bank select bits would be a one-to-one identity map. However, if the transmit frame caused a device failure, it might be necessary to re-run the frame with nominal transition edge placement.

TABLE I

Palette Bank Map for Variable Timing
Palette Bank Map for Variable Timing

| Virtual Palette Bank Select Code (From TDM 1205) | Physical Palette Bank Select Code (Output of Palette Bank Map) |
|---|---|
| 0 | 0 |
| 1 | 1 |
| 2 | 2 |
| 3 | 3 |

Without the palette bank map feature, a new frame would have to be created, with all palette bank select bits set to "1".

However, with the palette bank map feature, one can simply set all palette bank select physical bits in the palette bank map to "1" as shown in Table II below.

TABLE II

Palette Bank Map for Nominal Timing
Palette Bank Map for Nominal Timing

| Virtual Palette Bank Select Code (From TDM 1205) | Physical Palette Bank Select Code (Output of Palette Bank Map) |
|---|---|
| 0 | 1 |
| 1 | 1 |
| 2 | 1 |
| 3 | 1 |

Figure 29:
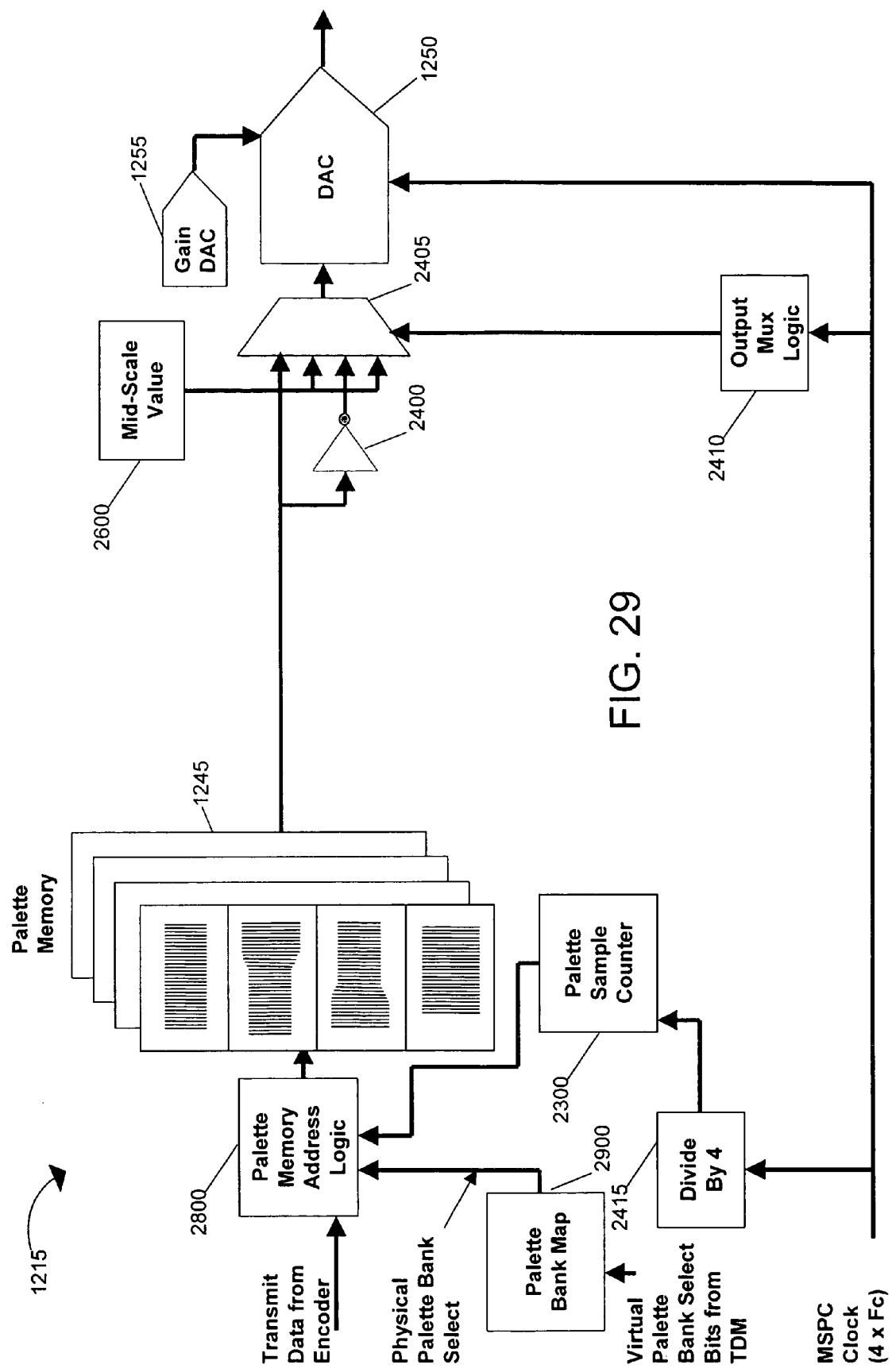
FIG. 29 shows a schematic diagram of another exemplary embodiment of the modulator shown in FIG. 12 having a palette bank map.

A block diagram of the modulator with the addition of palette map hardware 2900 is shown in FIG. 29.

Figure 30:
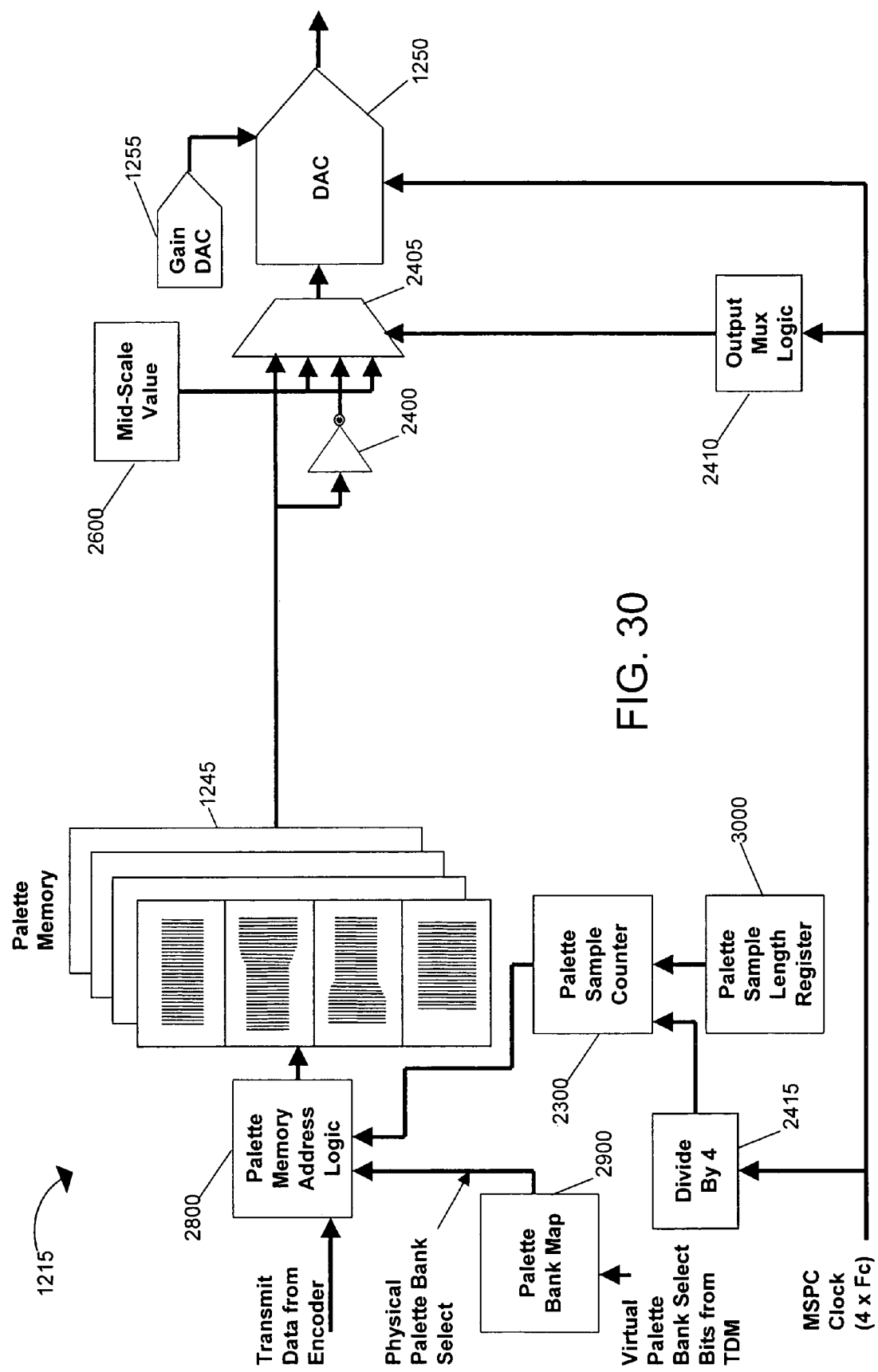
FIG. 30 shows a schematic diagram of another exemplary embodiment of the modulator shown in FIG. 12 having a palette sample length register.

The ISO 14443 standard further provides for higher data transmission speeds by reducing the number of Fc cycles per ETU. The default ETU period is 128 Fc cycles, which translates to roughly 106 KBit per second. However, by using only 64 Fc per ETU, a transmission speed of roughly 212 KBit per second is possible. The ISO 14443 standard provides for ETU lengths of 128, 64, 32, and 16 Fc, yielding approximately 106, 212, 424, and 848 KBit per second, respectively. This is implemented in modulator 1215 by adding a pre-load register to the palette sample counter, known as the "Paulette Sample Length Register." When the palette sample counter reaches maximum count, the counter is pre-loaded with the contents of the palette sample length register. Note that this allows an ETU to be any length, not just a binary multiple of Fc counts. FIG. 30 illustrates a block diagram for this addition, i.e., palette sample length register 3000.

Figure 31:
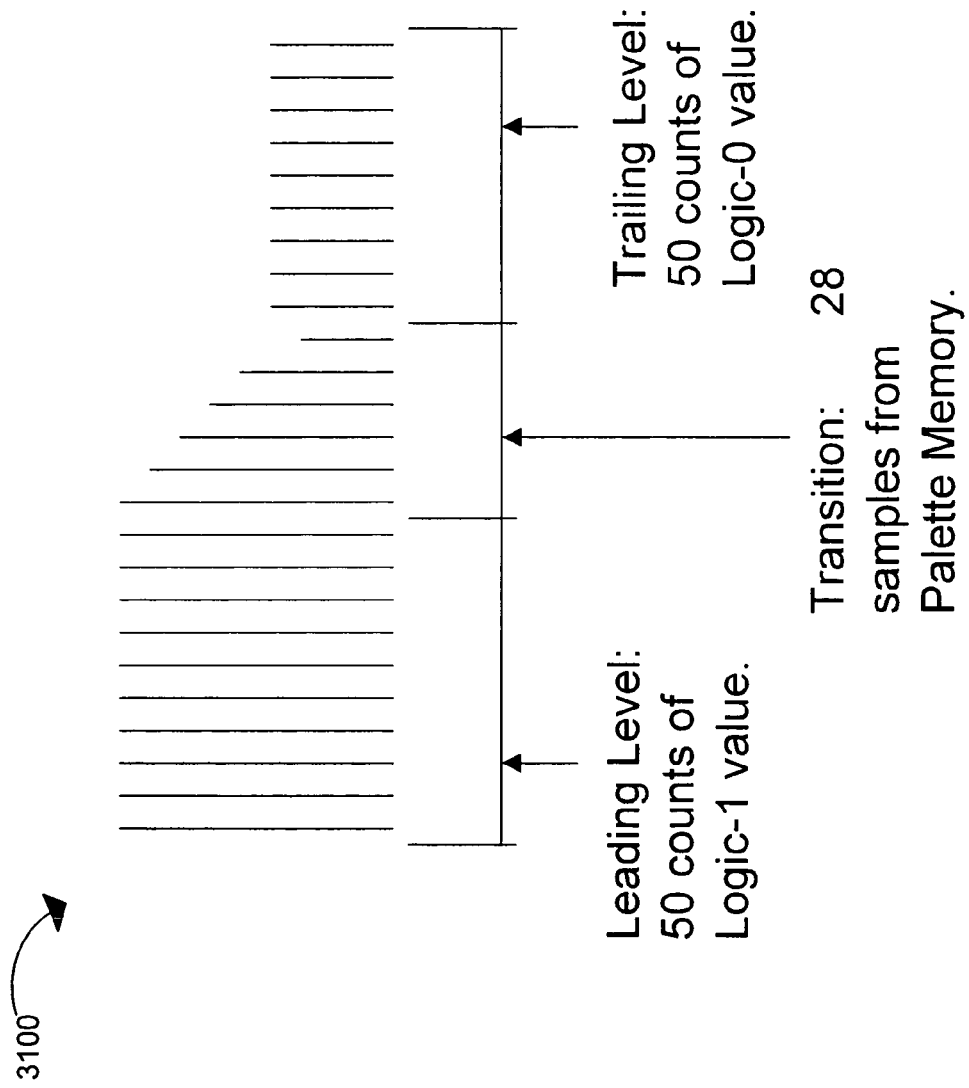
FIG. 31 illustrates palette waveform compression for use with the modulator shown in FIG. 12.

Modulator 1215 may be enhanced even further with the recognition that each palette waveform includes two (possible identical) levels separated by a transition. The "leading" level is held constant, until the transition to the next level occurs. After the transition, the "trailing" level is held constant. The value of the leading or trailing level is either the un-modulated carrier (a logic-1) or a fully modulated carrier (a logic-0). Therefore, the two levels may be implemented by two registers, each containing the appropriate digital value for the logic-1 or logic-0 modulation values. Each level is applied for some duration of Fc cycles. Therefore, a counter is associated with the leading and trailing durations. The sum of the leading duration, palette sample duration, and trailing duration is the length of the ETU. Note that which level to apply is determined by the logic in encoder 1210 (FIG. 12). Generation of a one to zero symbol transition is illustrated in FIG. 31.

Figure 32:
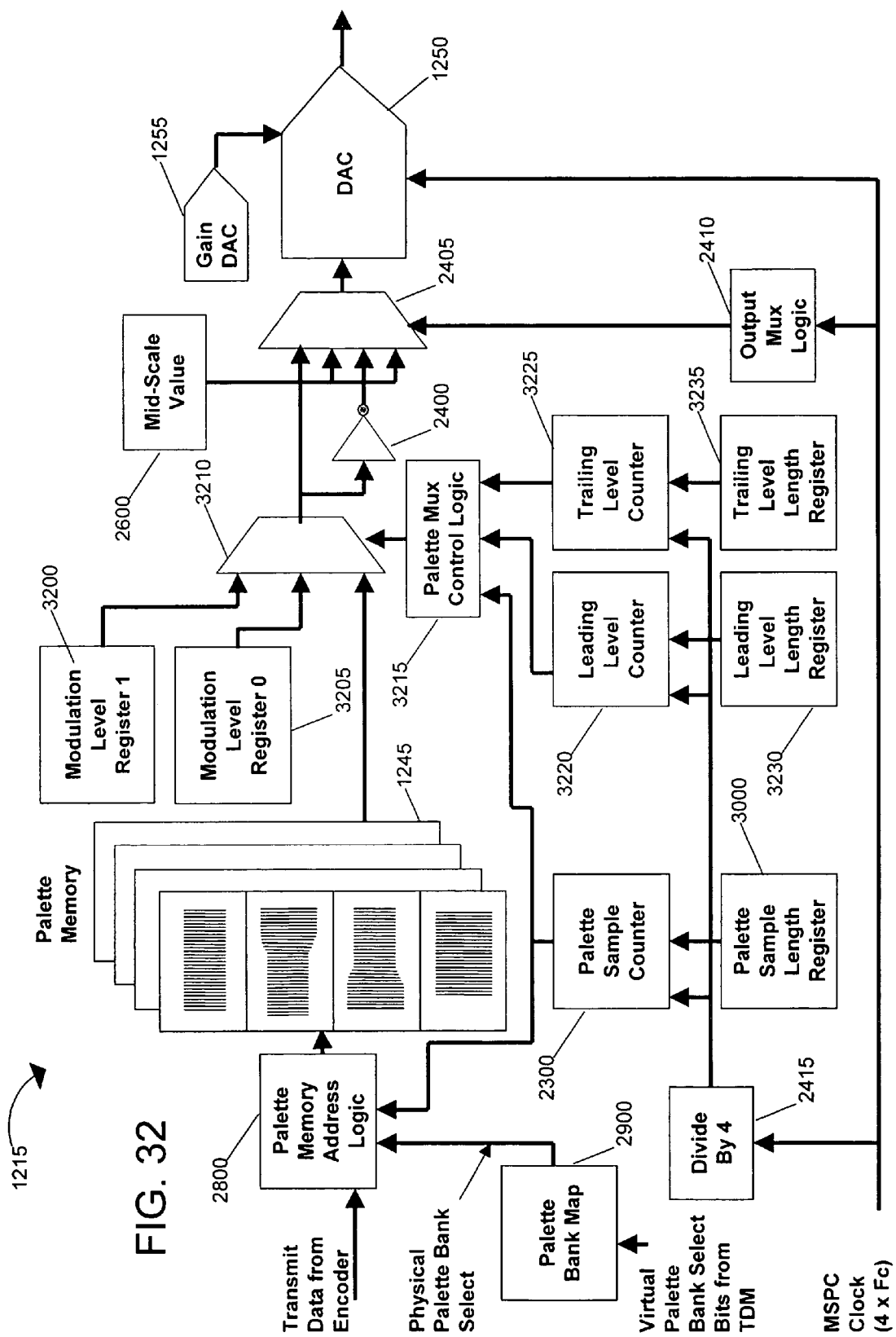
FIG. 32 shows a schematic diagram of another exemplary embodiment of the modulator shown in FIG. 12 having fixed-level compression.

Since the ETU length is variable, and palette sample counter 2300 is therefore programmable, both the leading and trailing level counters should also be pre-loadable. If we assume that the leading and trailing counters will always be responsible for generating some portion of the ETU waveform, we can reduce the number of samples that must be stored in palette memory 1245, and thus the overall size of palette memory 1245. A reasonable assumption would be that palette memory 1245 supplies ¼ (25%) of the samples in an ETU, while the level counters provide the other 75% of the samples. Assuming a maximum length ETU of 128 Fc, each counter should provide a maximum of 96 samples, and palette sample counter 2300 should provide a maximum of 32 samples. While the number of leading and trailing level counts is programmable, normally the value of all the counters will sum to 128. However, with this scheme, it is possible to generate an ETU longer than the maximum spec of 128 Fc. This is required for some tests, and was not possible in any of the prior modulation schemes. The hardware that supports this is illustrated in FIG. 32. Besides the additional registers and counters, namely, level registers 3200 and 3205, leading level counter 3220, trailing level counter 3225, leading level length register 3230, and trailing level length register 3235, control logic 3215 is added to drive mux 3210 that selects one of level registers 3200 and 3205 or palette memory 1245.

The next modulation enhancement adds the ability to both reduce palette memory usage and move symbol transitions within an ETU for every ETU cycle. This capability allows both a transition waveform (perhaps containing unique rise/fall times) and a transition time to be selected by the palette bank select bits in TDM 1205. This provides a timing flexibility akin to a digital pin-channel. To accomplish this, the palette, leading and trailing level length registers should each be changed to a four entry register file. The entry to use is selected by the physical palette select bits from the palette bank map, as shown in FIG. 33.

Another modulation enhancement makes use of the observation that the waveforms generated by modulator 1215 should always vary in a continuous fashion; there can be no abrupt changes between modulation levels, and every change between levels is performed by waveforms in palette memory 1245. Therefore, it is the case that the last value in a palette memory transition waveform is the same value as the following "trailing" level. In fact, the value of the next ETU's "leading" level after a prior ETU's trailing level should also be the same. Accordingly, the first value in a palette memory transition waveform is also the same as the value in the "leading" modulation level register.

Figure 33:
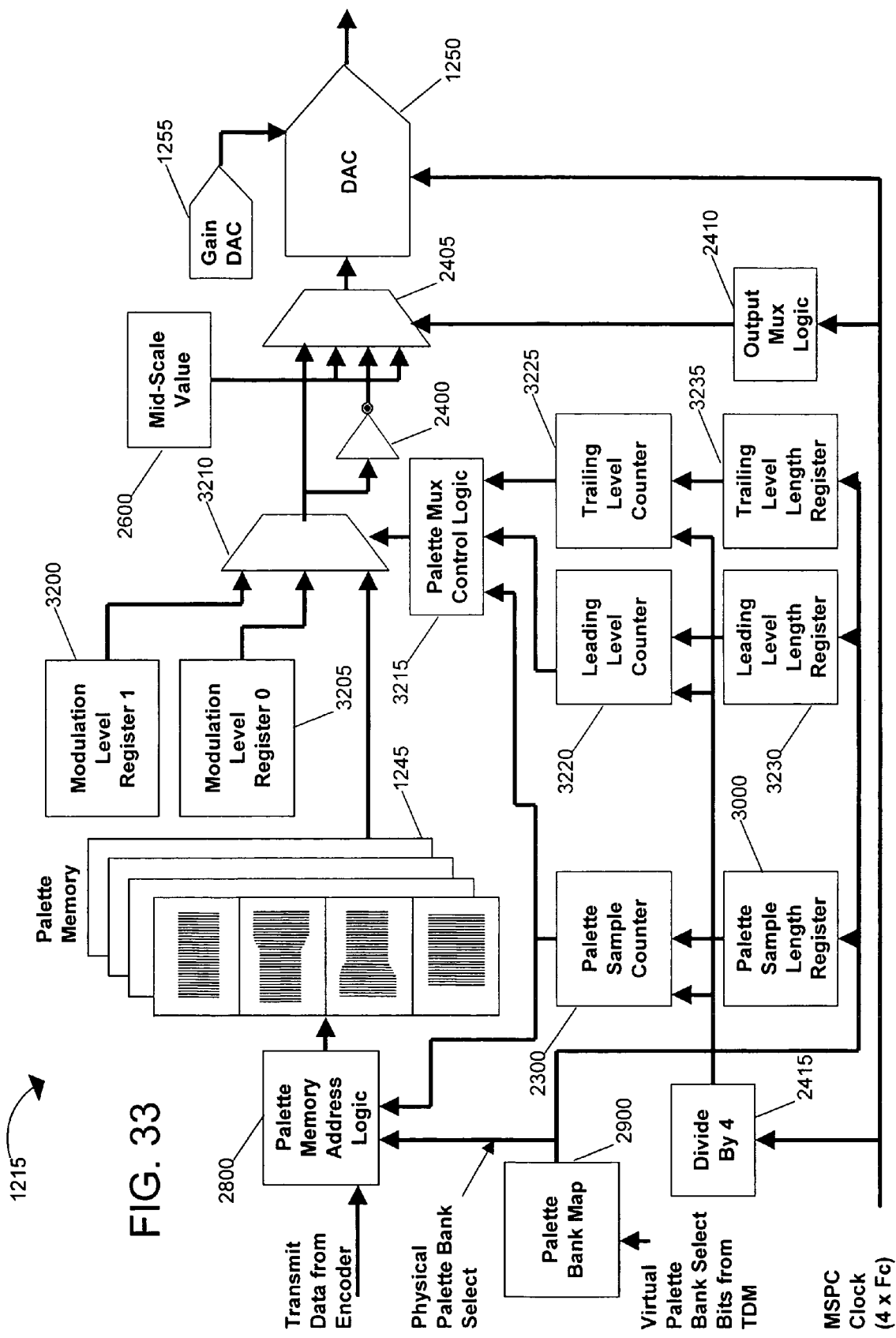
FIG. 33 shows a schematic diagram of another exemplary embodiment of the modulator shown in FIG. 12 having bank selected fixed-level compression.
Figure 34:
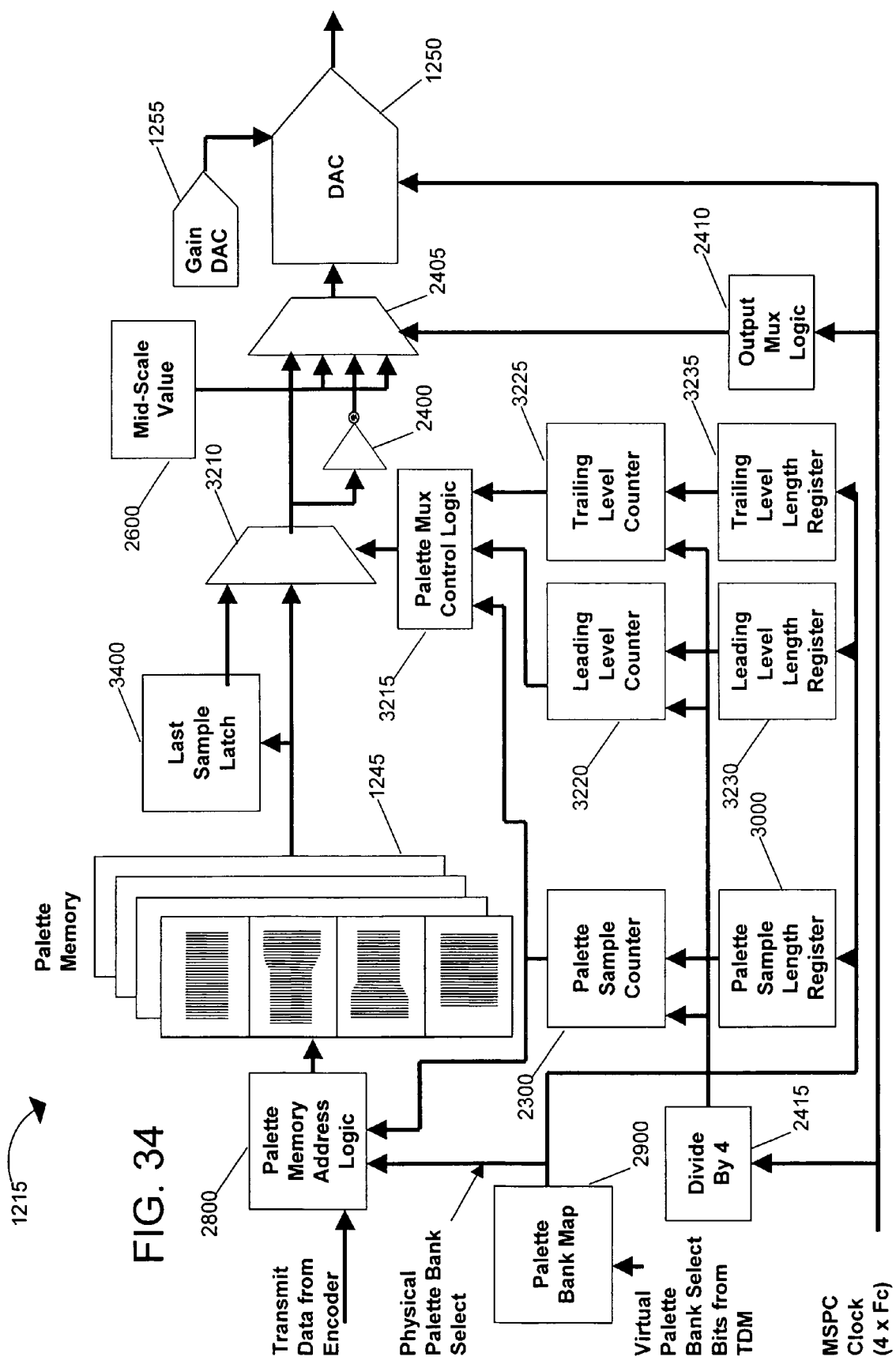
FIG. 34 shows a schematic diagram of another exemplary embodiment of the modulator shown in FIG. 12 implementing a last sample repeat function.

Because of this, the two modulation level registers shown in FIG. 33 (level registers 3200 and 3205) may be eliminated. It may be sufficient to latch the last value in the palette memory transition waveform, and simply repeat this value for the leading and trailing level durations, until the next palette memory transition waveform is selected. This has several advantages, besides hardware simplification. First, modulator 1215 is easier to program, and it is easier to make waveform transitions consistent, because level information is maintained in only one place, palette memory 1245. Second, this allows the modulation depth to vary ETU by ETU, simply by selecting palette banks with different modulation depths. This also allows future multi-bit per ETU schemes to work without adding significant special-purpose hardware support. FIG. 34 is a block diagram illustrating modulator 1215 with this last sample repeat function implemented using last sample latch 3400.

Palette Memory Management

The prior discussion of modulator 1215 made mention of variable sizes of palette waveforms, different numbers of palette banks, etc. In some circumstances, palette memory 1245 might be mostly unused, which would waste a scarce resource. However, it is possible to manage palette memory 1245 by allowing use of otherwise wasted space through an address mapping scheme. This hinges on a trade-off of palette size vs. the number of palette banks. The following information is used to address the Palette RAM:

Palette Sample Address: The address of a specific digitized sample within one palette waveform. This is provided by the Palette Sample Counter. The address changes every Fc cycle while the palette is being accessed for waveform generation. There are a maximum of 7 bits (128 samples).

Current Data Bit: This is the data bit from encoder 1210, and may change every ETU. This is essentially the "next data bit" that the waveform transition is transitioning between.

The Current Data Bit and the Look-behind Data Bit select one of four waveforms from within one palette memory bank.

Look-behind Data Bit: This is a one-ETU delayed data bit from the encoder circuit, and may change every ETU. This is the "prior data bit" that the waveform transition is transitioning between. The Current Data Bit and the Look-behind Data Bit select one of four waveforms from within one palette memory bank.

Physical Palette Bank Select: These two bits select one of four palette memory banks. These bits come from the palette bank map, and may change every ETU.

The above totals 11 bits. However, in one exemplary embodiment, palette memory 1245 is implemented in a Field Programmable Gate Array ("FPGA"), which is organized in 4K word blocks, so 12 bits are required to address palette memory 1245. This $12^{th}$ bit is provided as a static, i.e., register, bit, and is used to select one of two "Palette Bank Groups." This can be thought of as selecting two different waveform sets that can be interchanged between the execution of each frame set. One use for this is to provide two groups of waveforms, with different modulation indexes. These two groups can be loaded once, and then quickly selected as desired before each device test.

As mentioned, palette waveform sample size can be adjusted to handle shorter ETU lengths. If shorter waveform lengths are used, memory can be freed up for other uses. In this case, this additional memory appears as additional palette bank groups, which are statically selected by a register. The selection of transition waveform length is another static selection, via the "palette size" register. Table III below lists the available Palette Size selections:

TABLE III

Palette Size Selections

| Palette Size Bit Code | Available Palette Size (Samples) | Available Palette Bank Groups |
|---|---|---|
| 00b | 16 | 16 |
| 01b | 32 | 8 |
| 10b | 64 | 4 |
| 11b | 128 | 2 |

Figure 35:
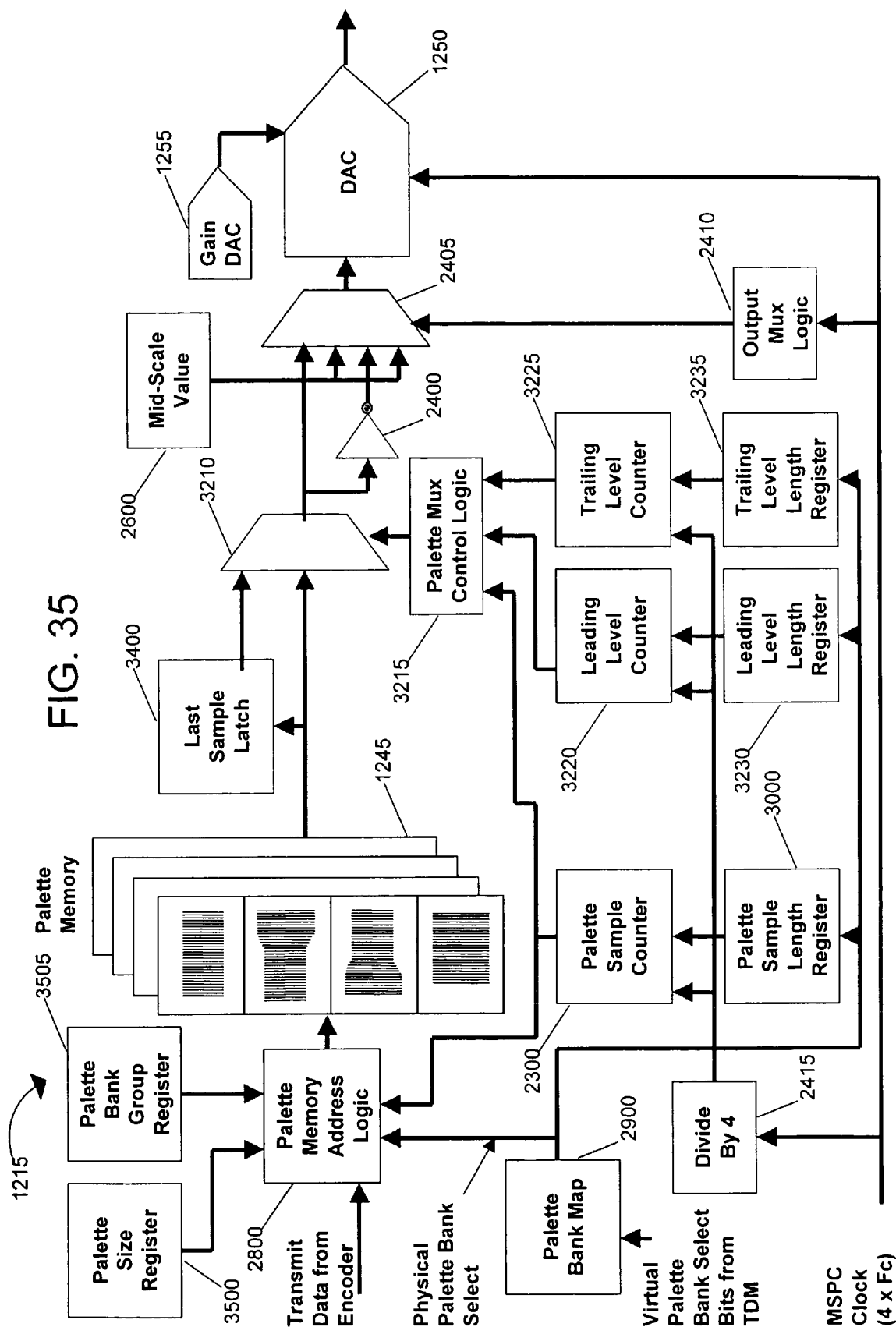
FIG. 35 shows a schematic diagram of another exemplary embodiment of the modulator shown in FIG. 12 with adjustable palette size.

A block diagram of modulator 1215 with adjustable palette size is shown in FIG. 35, with palette size register 3500 and palette bank group register 3505.

Carrier Ramp Generation

As previously mentioned, the carrier cannot be abruptly started; it should be ramped to its maximum value over a user defined interval. This is equivalent to modulating the carrier with a ramp that starts at zero and ends at the carrier maximum value. The ramp duration is variable, from a few microseconds to a few seconds. This duration range is far too long for palette memory 1245 to be used as the ramp waveform source. However, since the carrier and its modulation are generated digitally, this can be readily accomplished with a simple counter circuit.

Figure 36:
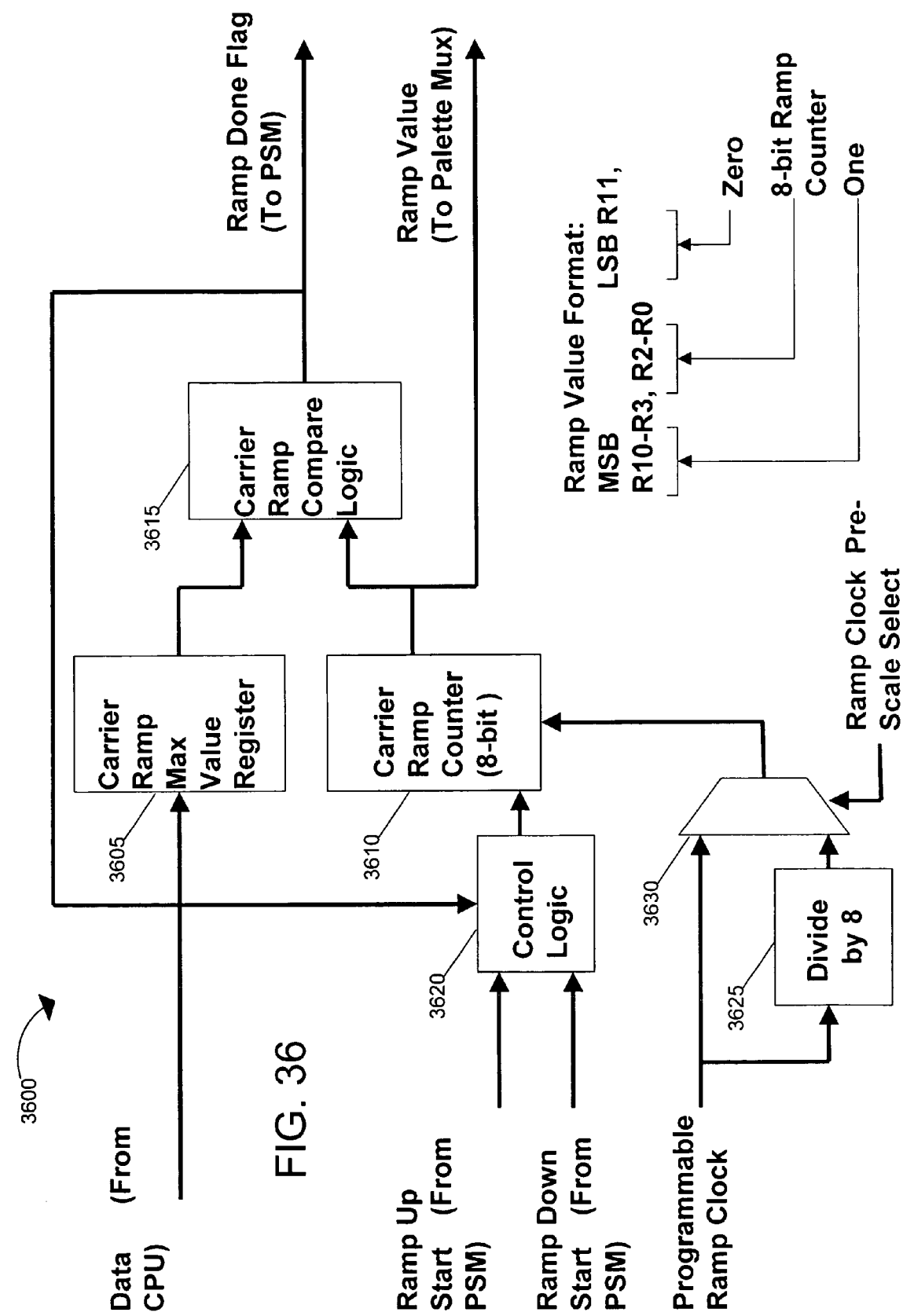
FIG. 36 shows a schematic diagram of a carrier ramp generator for use with the modulator shown in FIG. 12.

FIG. 36 is a block diagram illustrating the carrier ramp generator. Register 3605 contains the carrier ramp maximum value. An 8-bit carrier ramp counter (counter 3610) is initialized to zero, and is incremented by an independent MSPC clock that is not related to the SCI Fc clock. This clock may also be pre-scaled to generate long duration ramps. The carrier ramp counter value is compared with the carrier maximum value register by comparator logic 3615.

Figure 37:
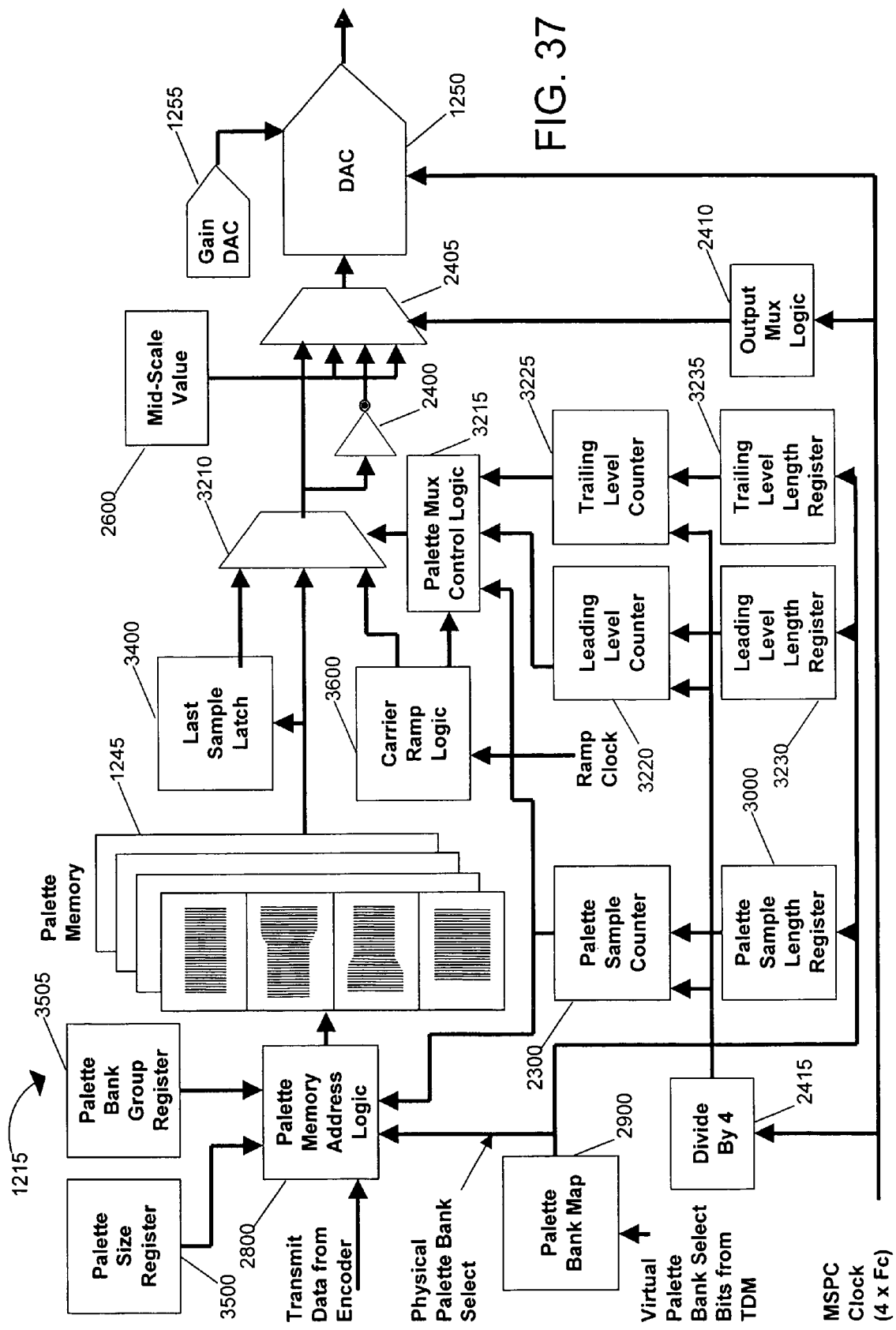
FIG. 37 shows a schematic diagram of the carrier ramp generator shown in FIG. 36 integrated with the modulator shown in FIG. 12.

When the counter is equal to the register, incrementing is halted. Carrier ramp counter 3610 may also be decremented, in which case it will halt when it reaches zero. Note that counter 3610 is only 8-bits, although all modulator waveform values are 12-bits. As shown in FIG. 36, counter 3610 provides bits 3 through 11 of the 12-bit carrier ramp waveform field. The lowest 3 bits are always zero. The upper bit is the sign bit, and is always one. Providing only 8 counter bits trades-off counter complexity for carrier amplitude resolution. As with any other modulator waveform, the carrier ramp provides one "sample" every Fc cycle. The modulator output mux turns this into a four-sample waveform by switching between mid-scale, sample, mid-scale, inverted-sample at a 4×Fc rate. A block diagram illustrating the carrier ramp generator integrated into the modulator is shown in FIG. 37.

Advantageously, the modulator of the present invention uses a novel and unique "Palette Waveform" technique to provide the PDC to PICC transmission signal required by the ISO standard 14443. This technique provides great flexibility in waveform amplitude and timing characteristics to allow functional and parametric testing of RF smart cards.

Among its many features, the modulator designed in accordance with the present invention provides: (1) Controlled ramp-up and ramp-down of carrier amplitude with programmable ramp duration and programmable maximum carrier amplitude; (2) Programmable ETU length adjustable from 4 to 384 Fc cycles, with the length adjustable "on-the-fly," i.e., each ETU can vary, from a set of four possible values; (3) Programmable ETU transition shape. The transition between ETU symbols may be defined as a waveform. There may be four transition type waveforms, selected based on current ETU and prior ETU transmit data values. Each waveform may be user defined, one sample per Fc. The transition waveform duration may be programmable from 4 to 128 Fc. The transition waveform may be selected "on-the-fly," from a set of four possible waveforms for a given transition type; and (4) Programmable ETU transition placement. The starting time of a transition between ETU symbols may be programmable. The starting time can be 2 to 120 Fc cycles within the ETU. The starting time can vary "on-the-fly," i.e., each ETU can vary, from a set of four possible values.

It should be understood by one of ordinary skill in the art that while SCA 110 is targeted at contact-less smart card devices as specified by the ISO standard 14443, its implementation is general enough to allow testing of devices with non-compliant protocols and other standards.

The foregoing descriptions of specific embodiments and best mode of the present invention have been presented for purposes of illustration and description only. They are not intended to be exhaustive or to limit the invention to the precise forms disclosed. Specific features of the invention are shown in some drawings and not in others, for purposes of convenience only, and any feature may be combined with other features in accordance with the invention. Steps of the described processes may be reordered or combined, and other steps may be included. The embodiments were chosen and described in order to best explain the principles of the invention and its practical application, to thereby enable others skilled in the art to best utilize the invention and various embodiments with various modifications as are suited to the particular use contemplated. Further variations of the invention will be apparent to one skilled in the art in light of this disclosure and such variations are intended to fall within the scope of the appended claims and their equivalents.

What is claimed is:

1. A system for testing a plurality of radio frequency smart card devices, comprising a smart card module having a plurality of smart card instrument channels, each of the plurality of smart card instrument channels being adapted to test one of the plurality of radio frequency smart card devices, each of the plurality of smart card instrument channels being asynchronous and independent of others of the plurality of smart card instrument channels.

2. The system of claim 1, further comprising a mixed signal pin card board coupled to the smart card module.

3. The system of claim 2, further comprising an analog capture instrument module coupled to the mixed signal pin card board.

4. The system of claim 1, further comprising a relay matrix for coupling the plurality of smart card instrument channels to the plurality of smart card devices.

5. The system of claim 4, wherein the smart card module includes a set of common system resources for coupling the plurality of smart card instrument channels to the plurality of smart card devices.

6. The system of claim 5, wherein each of the plurality of smart card instrument channels comprises a transmitter and a receiver.

7. The system of claim 6, wherein the transmitter includes a transmit data memory, an encoder, and a modulator.

8. The system of claim 7, wherein the modulator includes a palette memory coupled to the encoder for use with a test signal having at least two data bits and configured to store a plurality of palette waveforms, each palette waveform corresponding to a transition between the two data bits.

9. The system of claim 8, wherein the palette memory is coupled to a digital to analog converter.

10. The system of claim 6, wherein the receiver includes a decoder, control logic, and a receive data memory.

11. The system of claim 6, wherein each of the plurality of smart card instrument channels includes a programmable state machine configured to manage the transmitter and the receiver.

12. The system of claim 1, wherein each of the plurality of smart card instrument channels comprises a transmitter and a receiver.

13. The system of claim 12, wherein each of the plurality of smart card instrument channels includes a programmable state machine configured to manage the transmitter and the receiver.

14. The system of claim 13, wherein each programmable state machine is configured to handle one of a new communication protocol and a modified communication protocol for communication with the radio frequency smart card devices.

15. The system of claim 13, wherein each programmable state machine is configured to perform AC parametric testing of the radio frequency smart card devices.

16. The system of claim 13, further comprising:
a palette memory system configured to store digitized symbol modulation waveforms for each of the plurality of smart card instrument channels; and
a digital to analog converter connected to the palette memory system and configured to convert digitized symbol modulation waveforms into an RF carrier with modulation to be sent to the radio frequency smart card devices.

17. The system of claim 16, further comprising an encoding system connected to the palette memory system and configured to select digitized symbol modulation waveforms for each bit of digital data to be sent to the radio frequency smart card devices.

* * * * *